United States Patent [19]

Srinivasan et al.

[11] Patent Number: 5,406,138
[45] Date of Patent: * Apr. 11, 1995

[54] PROGRAMMABLE INTERCONNECT ARCHITECTURE USING FEWER STORAGE CELLS THAN SWITCHES

[75] Inventors: Adi Srinivasan, Fremont; Ta-Pen Guo, Cupertino, both of Calif.

[73] Assignee: Aptix Corporation, San Jose, Calif.

[*] Notice: The portion of the term of this patent subsequent to Jun. 7, 2011 has been disclaimed.

[21] Appl. No.: 51,449

[22] Filed: Apr. 19, 1993

Related U.S. Application Data

[63] Continuation-in-part of Ser. No. 922,337, Jul. 30, 1992, Pat. No. 5,319,261.

[51] Int. Cl.⁶ .................. H03K 19/173; H03K 19/094
[52] U.S. Cl. .................................. 326/41; 340/825.91; 326/44
[58] Field of Search ............. 307/465, 465.1, 468; 340/825.83, 825.91, 825.93, 825.9, 825.89; 364/716, 491; 365/72, 96, 163

[56] References Cited

U.S. PATENT DOCUMENTS

| | | | |
|---|---|---|---|
| 3,852,723 | 12/1974 | Wu | 340/825.83 |
| 4,631,686 | 12/1986 | Ikawa et al. | 340/825.91 |
| 4,725,835 | 2/1988 | Schreiner et al. | 340/825.83 |
| 4,746,921 | 5/1988 | Hofmann | 340/825.91 |
| 4,758,745 | 7/1988 | Elgamal et al. | 307/465 |
| 4,771,284 | 9/1988 | Masleid et al. | 340/825.83 |
| 4,870,302 | 9/1989 | Freeman | 307/465 |
| 5,121,111 | 6/1992 | Trumpp et al. | 340/825.91 |

OTHER PUBLICATIONS

Shin et al., "A 5Gb/s 16×16 Si–Bipolar Crosspoint Switch", 1992, pp. 228–229.
Carpenter et al., "A 146Mb/s Time Space Switch Chip", 118FEB88, pp. 112–113.
Stuart K. Tewksbury, *Wafer–Level Integrated Systems: Implementation Issues,* 1989, p. 334 et seq.

*Primary Examiner*—Edward P. Westin
*Assistant Examiner*—Richard Roseen
*Attorney, Agent, or Firm*—D'Alessandro, Frazzini & Ritchie

[57] ABSTRACT

A first user re-programmable interconnect architecture is provided wherein N switching elements are connected between selected interconnect conductors. The switching elements are controlled by M active storage elements, where M<N. A group of N switching elements are controlled by a group of M active storage elements, where M<N. The states of the M active storage elements are collectively decoded to identify the one of N switching elements to be turned on. A second user re-programmable interconnect architecture is provided wherein a group of N switching elements are connected between selected interconnect conductors and are partially selected by decoding the states of $m_1$ active storage elements. The group of N switching elements are also partially selected by decoding the states of $m_2$ active storage elements. The decoding is arranged such that the states of $m_1$ and $m_2$ active storage elements each are decoded to provide a partial address to identify one of the N switching elements to be turned to its "on" state. The sum of $m_1$ and $m_2$ is less than N. Decoder lines in non-parallel relationship with the interconnect conductors provide increased routability. Partial depopulation of the matrices containing the switching elements provides added routability.

40 Claims, 14 Drawing Sheets

PROGRAMMABLE INTERCONNECT ARCHITECTURE USING FEWER STORAGE CELLS THAN SWITCHES

RELATED APPLICATIONS

This application is a continuation-in-part of patent application Ser. No. 07/922,337, filed Jul. 30, 1992, now U.S. Pat. No. 5,319,261.

BACKGROUND OF THE INVENTION

1. Field of the Invention

The present invention relates to user re-programmable interconnect architectures, which employ active devices as re-programmable interconnect elements whose programmed state is stored in an active storage element (typically a static RAM cell). More particularly, the present invention relates to such architectures employing fewer storage elements than reprogrammable interconnect elements and which employ decoding to activate individual interconnect paths.

2. The Prior Art

User-programmable interconnect integrated circuit architectures are known in the art. These architectures typically comprise a set of interconnect conductors in an integrated circuit which a user may programmably connect to one another by the use of programmable elements.

The prior art contains examples of such architectures using one-time programmable interconnect elements, such as antifuses. A typical example of an architecture employing one-time programmable antifuse elements is disclosed in U.S. Pat. No. 4,758,745. The prior art contains examples of such architectures using re-programmable interconnect elements, such as active switching devices, each of whose programmed state (i.e., "on" or "off") is stored in an associated active storage element (typically a static RAM cell). A typical example of such an architecture is disclosed in U.S. Pat. No. 4,870,302.

While prior art user re-programmable interconnect architectures have found application in a number of different devices, such as field-programmable gate array devices, they are inherently limited by the amount of area which must be taken up on the integrated circuit die to accommodate the active switching device, usually an N-channel pass transistor or a CMOS pass transistor pair, and its associated active storage element. Because of this area utilization necessary to accommodate the interconnect mechanism, the size of practically-realizable re-programmable interconnect architectures is limited.

Bipolar crosspoint switch implementations of such user-programmable interconnect integrated circuit architectures are known in the art. For example, H. Shin et al, "A 5Gb/s 16×16 Si-Bipolar Crosspoint Switch", 1992 IEEE ISSCC, pp. 228–229, describe a bipolar n by n crosspoint switch which requires n n:1 multiplexers. While such circuits are practically implementable in bipolar technology for reasonably small values of n (i.e., about less than n=256), such crosspoint architectures implemented in CMOS technology are not practical, since they would occupy more chip area than a fully populated matrix with one or more RAM cells used to drive each switch in the matrix as described above. In addition, in the architecture described in the Shin et al. paper, the number of crosspoints is necessarily quadratic in the number of objects (i.e., I/O pins or logic cell inputs and outputs) being switched. This attribute of this architecture severely restricts the number of objects which may be interconnected using a single reasonably sized integrated circuit die.

Time/space switch programmable architectures, such as that disclosed in S. Carpenter et al., "A 146 Mb/s Time Space Switch Chip", 1988 IEEE ISSCC, pp. 112—113, are also known in the art. The number of RAM cells used in such architectures is at least twice the number of switches being used to pass or block data at any given time.

It is an object of the present invention to provide a user re-programmable interconnect architecture in which the active switching device and its associated active storage element occupy less die area than in previous re-programmable interconnect architectures.

It is a further object of the present invention to provide a user re-programmable interconnect architecture in which N switching elements may be controlled by fewer than N active storage elements.

It is a further object of the present invention to provide a user re-programmable interconnect architecture in which N switching elements may be controlled by fewer than N active storage elements and in which a maximum number of interconnections is permitted.

It is a further object of the present invention to provide increased routability in a user re-programmable interconnect architecture through the use of non-parallel decoder lines thus increasing the number of creatable nets in a given number of switching elements.

It is a further object of the present invention to decrease the number of decoder lines required to control the switching elements to a single decoder line in each direction.

It is yet another object of the present invention to provide increased routability in a user re-programmable interconnect architecture in which N switching elements may be controlled by fewer than N active storage elements through the use of non-parallel single decoder lines and partial switch depopulation thus further increasing the number of nets creatable in a given number of switching elements.

BRIEF DESCRIPTION OF THE INVENTION

According to the present invention, a user re-programmable interconnect architecture is provided wherein N switching elements are connected between selected interconnect conductors. The switching elements are controlled by M active storage elements, where $M<N$. According to a first aspect of the present invention, a group of N switching elements are controlled by a group of M active storage elements, where $M<N$. The states of the M active storage elements are collectively decoded to identify the one of N switching elements to be turned on.

According to a second aspect of the present invention, a group of N switching elements are connected between selected interconnect conductors and are partially selected by the states of $m_1$ active storage elements. The group of N switching elements are also partially selected by the states of $m_2$ active storage elements. The statement $m_1 + m_2 < N$ is true. The states of $m_1$ and $m_2$ active storage elements each provide a partial address to uniquely identify one of the N switching elements to be turned to its "on" state.

By introducing very reasonable software routing constraints, a single active storage element may be used to control multiple switching elements in any of the embodiments of the present invention.

According to a third aspect of the present invention, switching elements on a given decoder line are not necessarily located on a common interconnect line, and preferably, no two switching elements have the same interconnect line and decoder line in common. This aspect of the present invention results in a significant increase in the number of possible independent nets per area, without an associated increase in transistor or other device area.

According to a fourth aspect of the present invention, partial depopulation of the switching elements within a switching matrix yields an increase in the number of creatable independent nets.

According to a fifth aspect of the present invention an "and" decode strategy is used to reduce the number of decode lines to a single decode line in each direction.

BRIEF DESCRIPTION OF THE DRAWINGS

FIG. 7b is a schematic diagram of an exemplary NOR-decode circuit for use in the decoder of FIG. 7a.

FIG. 7c is a schematic diagram of an exemplary NAND-decode circuit for use in the decoder of FIG. 7a.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

The term "user re-programmable interconnect element" is used herein with reference to a single N-Channel pass transistor. Those of ordinary skill in the art will recognize that other elements, including but not limited to, CMOS pass gates, P-Channel MOS transistors, and other switching elements considered by those of ordinary skill in the art to be equivalent user re-programmable interconnect elements are intended to be included herein. The term "active storage element" is used herein with reference to a static random access memory cell. Those of ordinary skill in the art will immediately recognize that other active storage elements may be used to perform the function disclosed herein. Such elements include, without limitation, DRAMs, EPROMs, EEPROMs, NOVRAMs, etc.

Prior art re-programmable interconnect architectures comprise a number (N) of re-programmable interconnect elements distributed among a set of metal interconnect conductor lines to permit the interconnection of groups of the metal interconnect conductor lines. The state of each interconnect element or switch ("on" or "off")is defined and maintained by the output of an associated active storage element, usually in the form of a static random access memory (SRAM) cell. Thus N SRAM cells are required to control N re-programmable interconnect elements. This permits any of $2^N$ "maps" (combinations of "on" and "off" switches) to be programmed.

In the case of programmable logic, the interconnect conductors and switches permit the connection of inputs/outputs of logic devices (e.g. boolean gates, multiplexers, latches) to each other and I/O pads. In the case of programmable interconnect, the interconnect conductors and switches connect external (to the chip) signals, as specified by the user, through I/O pads.

Figure 1:
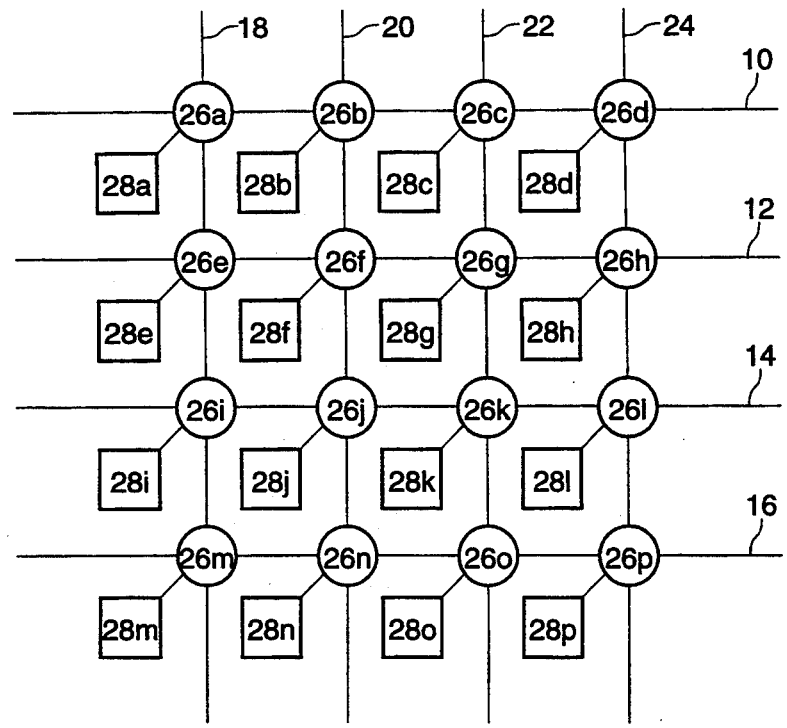
FIG. 1 is a schematic diagram of a typical prior-art user re-programmable interconnect architecture.

A typical prior-art re-programmable interconnect architecture is shown in FIG. 1. A plurality of horizontally-oriented interconnect conductors 10, 12, 14, and 16, usually in the form of metal lines in an integrated circuit or other microcircuit structure, are intersected by vertically-oriented interconnect conductors 18, 20, 22, and 24. A plurality of user re-programmable interconnect elements 26a–26p are connected between the horizontal and vertical interconnect conductors at the intersections. For example, user re-programmable interconnect element 26a is disposed at the intersection of horizontal interconnect conductor 10 and vertical interconnect conductor 18. Each user re-programmable interconnect element is a switching element which has two states. In a first "off" state, the interconnect conductors connected by the element remain electrically isolated from one another. In a second "on" state, the interconnect conductors are electrically connected together by a low-resistance path.

In the embodiment of FIG. 1, the intersections of horizontal and vertical interconnect conductors are 100% populated by user re-programmable interconnect elements, but those of ordinary skill in the art will recognize that the embodiment depicted in FIG. 1 is illustrative only and that actual implementations of such architecture may be less than 100% populated. Those of ordinary skill in the art will also recognize that, while FIG. 1 shows user re-programmable interconnect elements located at intersecting horizontal and vertical interconnect conductors, such user re-programmable interconnect elements may also be located at ends of segmented interconnect conductors to form longer conductor lengths, or between one of such conductors and another circuit element, such as an I/O pad or the input or output of a circuit disposed on the integrated circuit substrate.

Each of user re-programmable interconnect elements 26a–26p has associated with it an active storage element 28a–28p, respectively. The active storage element controls the state of the user re-programmable interconnect element with which it is associated by providing an output signal which defines the state of the user re-programmable interconnect element. The prior art is characterized by provision of at least one active storage element per user re-programmable interconnect element.

Figure 2:
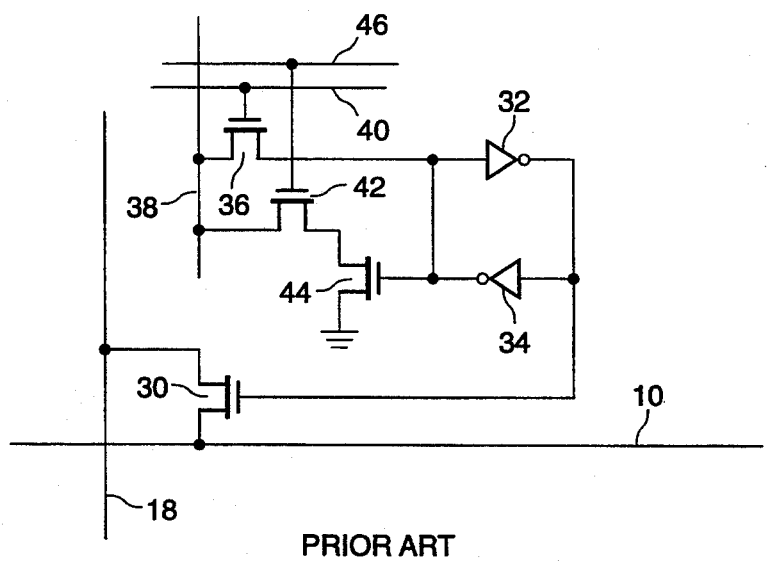
FIG. 2 is a schematic diagram of a typical switching element in combination with an active storage element as used in the prior-art user re-programmable interconnect architecture of FIG. 1.

Referring now to FIG. 2, a schematic diagram illustrates a user re-programmable interconnect element in combination with its active storage element driver circuit. N-Channel MOS transistor 30 comprises the user re-programmable interconnect element and is shown connected between horizontal interconnect conductor 10 and vertical interconnect conductor 18. The gate of N-Channel MOS transistor 30 acts to switch it between its "off" state and its "on" state.

In most architectures, the active storage element is located on the periphery of the integrated circuit, and connections are made to the gates of the switching transistors via metal lines in the integrated circuit. The active storage element comprises a static random-access memory cell including cross coupled inverters 32 and 34. The common node comprising the output of inverter 32 and the input of inverter 34 is the output node of the active storage element and drives the gate of N-Channel MOS transistor 30. An N-Channel MOS transistor 36 is connected between the common node comprising the output of inverter 34 and the input of inverter 32 and a bit line 38. The gate of N-Channel MOS transistor 36 is connected to a write word line 40. N-Channel MOS transistors 42 and 44 are connected in series between bit line 38 and ground. The gate of N-Channel MOS transistor 42 is connected to a read word line 46 and the gate of N-Channel MOS transistor 44 is connected to the common node comprising the output of inverter 34 and the input of inverter 32.

To read the state of the active storage element, read word line 46 is brought high. This turns on N-Channel MOS transistor 42. If the output of the active storage element is high, N-Channel MOS transistor 44 will be off because its gate is low (through inverter 34) and the bit line 38 will remain high. If the output of the active storage element is low, N-Channel MOS transistor 44 will be on because its gate is high (through inverter 34) and the bit line 38 will be pulled low through N-Channel MOS transistors 42 and 44.

To write to the active storage element, N-Channel MOS transistor 36 is turned on by placing a high level on write word line 40. Transistor 36 turns on and forces the common node comprising the output of inverter 34 and the input of inverter 32 to the state of bit line 38.

The prior art re-programmable interconnect architecture described above contains far more switching elements than are needed to configure any specified connectivity pattern. This is due to the design restraints that the architecture must be general and there must be enough freedom for the router to accomplish the desired connectivity. Also, in general, it may be observed that, when the architecture is programmed to implement some specified connectivity, the programmed switching elements are not concentrated in a particular region of the circuit. This is because the objects to be connected (I/O pads or logic devices) are geometrically spread over the architecture, so the "on" switches which connect them are also not clustered. Typically this means that only a small number of switches are "on" for any specified interconnectivity.

Figure 3:
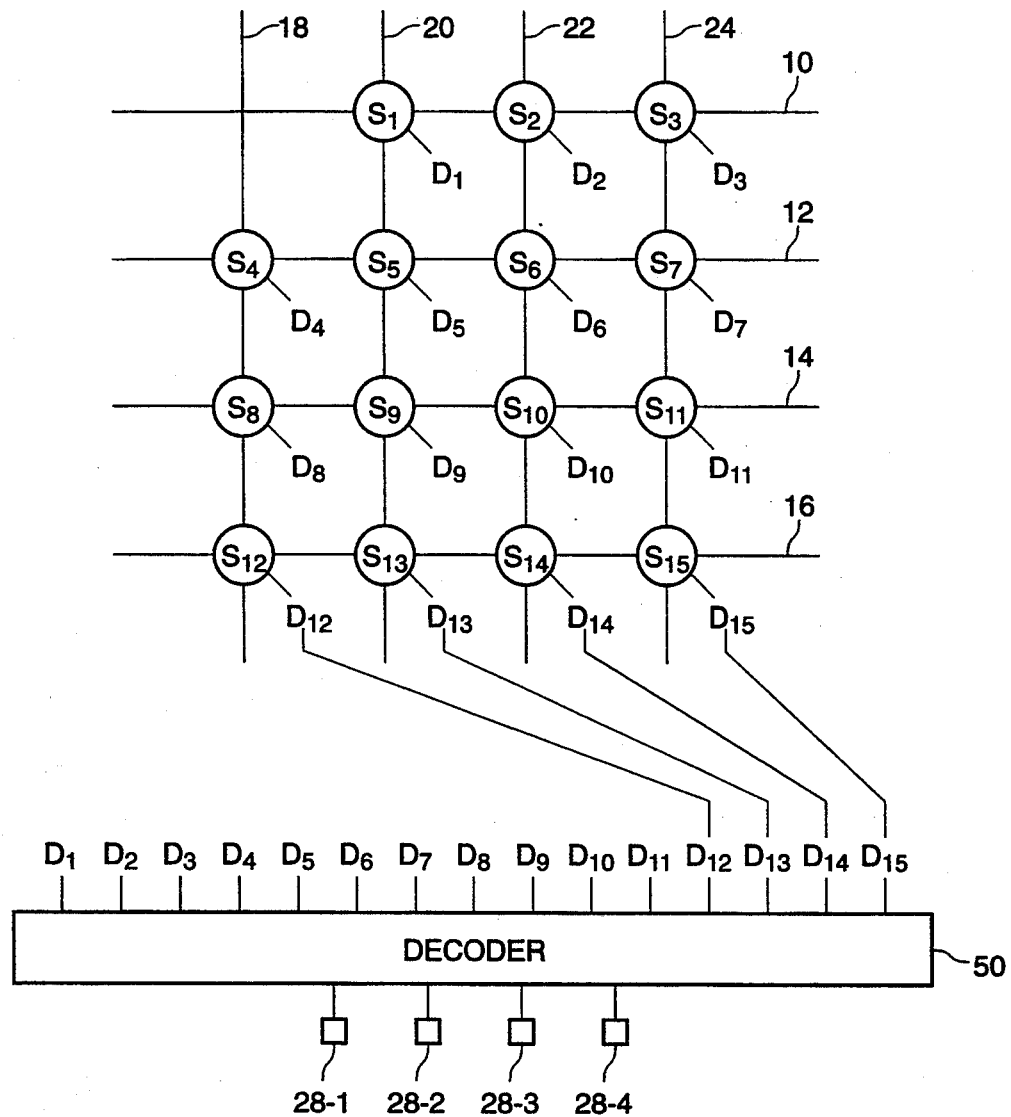
FIG. 3 is a schematic/block diagram of a portion of a user re-programmable interconnect architecture according to a first embodiment of the present invention.

Referring now to FIG. 3, a user-re-programmable interconnect architecture according to a first embodiment of the invention is depicted in combined block and schematic diagram form. Horizontal interconnect conductors 10, 12, 14, and 16 are shown intersecting vertical interconnect conductors 18, 20, 22, and 24. User-re-programmable interconnect elements $S_1$–$S_{15}$ are shown at the intersections of the horizontal and vertical interconnect conductors. It will be noted that, according to a presently preferred embodiment of the invention, not all intersections are populated by user re-programmable interconnect elements (the intersection of interconnect conductors 10 and 18 remains unpopulated).

Unlike the prior art architectures which provide one active storage element for each user re-programmable interconnect element, the embodiment of FIG. 3 includes only active storage elements 28-1 through 28-4. Active storage elements 28-1 through 28-4 are used to drive decoder circuit 50. Decoder 50 may be a conventional decoder which translates a 4-bit binary input from active storage elements 28-1 through 28-4 to a one-of-fifteen high-active signal as is well known in the art. The outputs $D_1$ through $D_{15}$ are used to drive user-reprogrammable interconnect elements $S_1$–$S_{15}$, respectively.

By employing the present invention, the number of active storage elements required to drive fifteen user re-programmable interconnect elements is reduced from fifteen to four. It is preferred to provide one state of decoder 50 which does not turn on any user re-programmable interconnect element in order to allow for interconnection networks in which none of user-reprogrammable interconnect elements $S_1$–$S_{15}$ are activated. In the embodiment of FIG. 3, this is accomplished by leaving one intersection (that of horizontal interconnect conductor 10 and vertical interconnect conductor 18) unpopulated so that address 0000 (binary) does not drive any output. Those of ordinary skill in the art will recognize that other similar schemes are possible to achieve this result.

Figure 4:
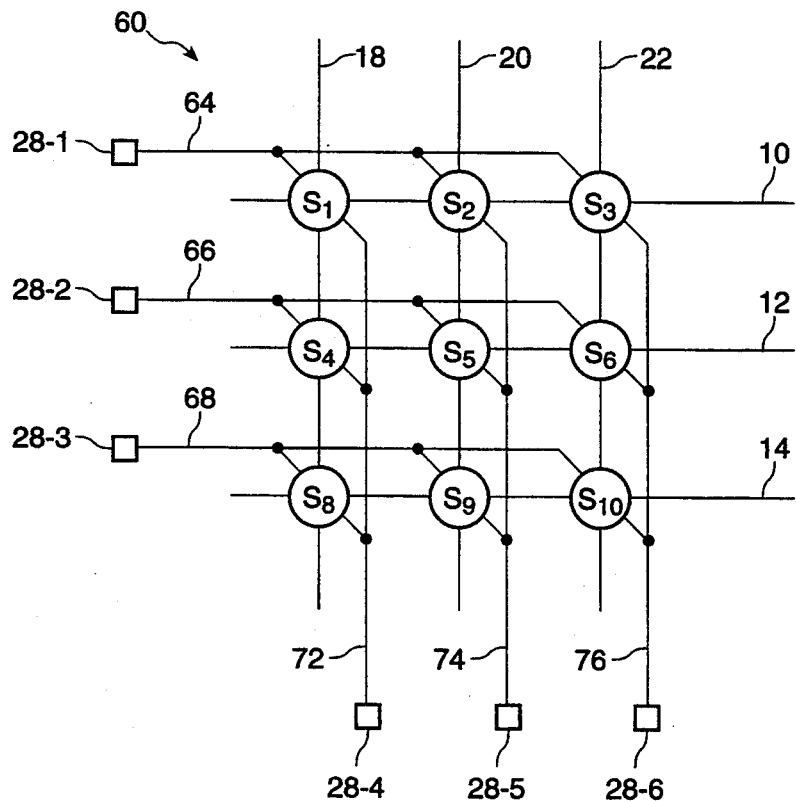
FIG. 4 is a schematic/block diagram of a user re-programmable interconnect architecture according to a second embodiment of the present invention.

Referring now to FIG. 4, an architecture 60 according to a second embodiment of the invention is depicted. Horizontal interconnect conductors 10, 12, and 14 are shown intersected by vertical conductors 18, 20, and 22. User re-programmable interconnect elements $S_1$–$S_9$ are shown populating the intersections of the horizontal and vertical interconnect conductors.

The states of active storage cells 28-1, 28-2, and 28-3 and their complements are placed onto pairs of decoder lines 64, 66, and 68. Although three decoder lines are shown, those of ordinary skill in the art will recognize that each of lines 64, 66, and 68 comprise a pair of lines carrying complementary signals. Similarly, the states of active storage cells 28-4, 28-5, and 28-6 and their complements are placed onto pairs of decoder lines 72, 74, and 76. The signals from the active storage cells 28-1, 28-2, 28-3, 28-4, 28-5, and 28-6 may be ANDed together to produce the signal to drive any one of switches $S_1-S_9$.

Figure 5:
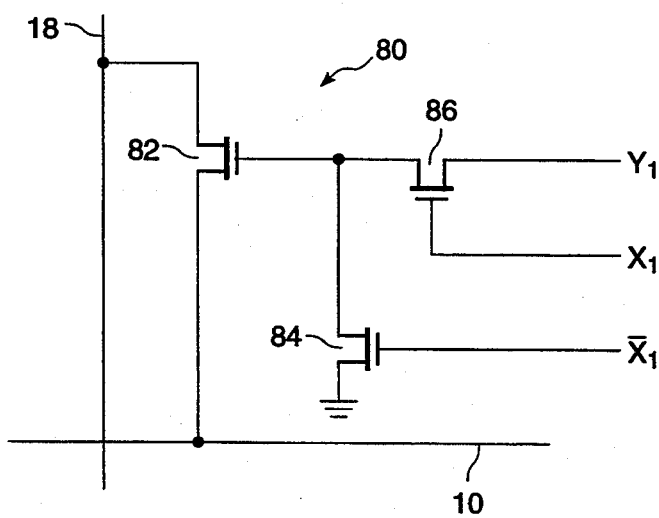
FIG. 5 is a schematic diagram of a typical 3-decoder line ANDing circuit switching element which may be used in the user re-programmable interconnect architecture of FIG. 4.

Appropriate switching circuitry 80 for accomplishing the ANDing of these control signals is shown in FIG. 5. FIG. 5 shows in detail the intersection of horizontal interconnect conductor 10 and vertical interconnect conductor 18. Switch $S_1$ comprises N-Channel MOS transistor 82. N-Channel MOS transistors 84 and 86 comprise an AND gate for controlling the gate of N-Channel MOS transistor 82. N-Channel MOS transistor 84 is connected between the gate of N-Channel MOS transistor 82 and ground, and has its gate connected to the complement of the X active storage cell for the first row of the switch matrix. N-Channel MOS transistor 86 is connected between the gate of N-Channel MOS transistor 82 and the output of the Y active storage cell for the first column of the switch matrix, and has its gate connected to the X active storage cell output signal for the first row of the switch matrix. If the decoder signals are active high, N-Channel MOS transistor 84 will be turned on, shorting the gate of N-Channel MOS transistor 82 to ground unless the row containing switch $S_1$ is selected. If the row is selected, the gate of N-Channel MOS transistor 82 is brought high only if the column containing switch $S_1$ is selected.

Figure 6:
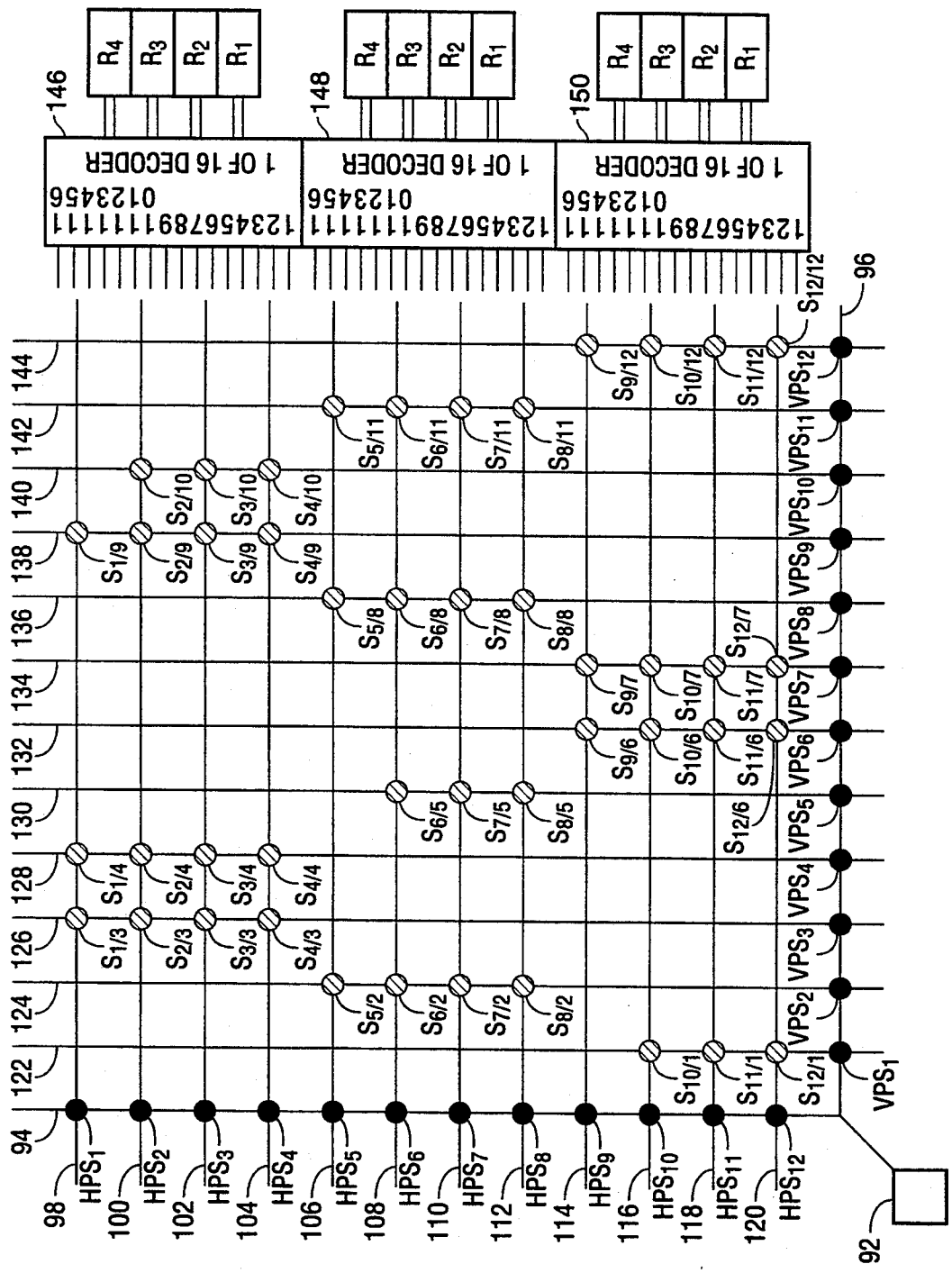
FIG. 6 is a schematic diagram of a portion of a user re-programmable interconnect architecture according to a third embodiment of the present invention.

Referring now to FIG. 6, an user re-configurable interconnect architecture according to a third embodiment of the present invention is depicted. The embodiment of FIG. 6 is especially suitable for use as a part of an interconnect matrix implementation.

An I/O pad 92 is electrically connected to pad stubs 94 and 96. Pad stubs 94 and 96 are orthogonally oriented to one another. Vertical pad stub 94 is oriented orthogonal to a plurality of horizontal interconnect conductors (12 are shown) 98, 100, 102, 104, 106, 108, 110, 112, 114, 116, 118, and 120. Horizontal pad stub 96 is oriented orthogonal to a plurality of vertical interconnect conductors (12 are shown) 122, 124, 1126, 128, 130, 132, 134, 136, 138, 140, 142, and 144.

The horizontal and vertical interconnect conductors may be connected to the I/O pad 92 through the pad stubs 94 and 96 by user re-programmable interconnect elements. According to a presently preferred embodiment of the invention, the intersections of the horizontal interconnect conductors and the vertical pad stub 94 are fully populated by user re-programmable interconnect elements $HPS_1-HPS_{12}$, and the intersections of the vertical interconnect conductors and the horizontal pad stub 96 are fully populated by user re-programmable interconnect elements $VPS_1-VPS_{12}$.

In addition, the horizontal and vertical interconnect conductors may be connected to one another by user re-programmable interconnect elements. It is apparent from an examination of FIG. 6 that the intersection matrix formed by the horizontal and vertical interconnect conductors are not fully populated by user re-programmable interconnect elements.

In the embodiment of FIG. 6, the interconnect elements are divided into three groups. The first group includes re-programmable interconnect elements (in a format $S_{x/y}$, where X is the position of the x conductor and Y is the position of the Y conductor) $S_{1/3}$, $S_{1/4}$, and $S_{1/9}$; $S_{2/3}$, $S_{2/4}$, $S_{2/9}$ and $S_{2/10}$; $S_{3/3}$, $S_{3/4}$, $S_{3/9}$, and $S_{3/10}$; and $S_{4/3}$, $S_{4/4}$, $S_{4/9}$, and $S_{4/10}$. The first group of re-programmable interconnect elements are controlled by the fifteen outputs of first decoder 146, which is driven by active storage elements 28-1 to 28-4. The second group includes re-programmable interconnect elements $S_{5/2}$, $S_{5/8}$, and $S_{5/11}$; $S_{6/2}$, $S_{6/5}$, $S_{6/8}$, and $S_{6/11}$; $S_{7/2}$, $S_{7/5}$, $S_{7/8}$, and $S_{7/11}$; and $S_{8/2}$, $S_{8/5}$ $S_{8/8}$, and $S_{8/11}$. The second group of re-programmable interconnect elements are controlled by the fifteen outputs of second decoder 148, which is driven by active storage elements 28-5 to 28-8. The third group includes re-programmable interconnect elements $S_{9/6}$, $S_{9/7}$, and $S_{9/12}$, and $S_{10/1}$; $S_{10/6}$, $S_{10/7}$, and $S_{10/12}$; $S_{11/1}$, $S_{11/6}$, $S_{11/7}$, and $S_{11/12}$; and $S_{12/1}$, $S_{12/6}$, $S_{12/7}$, and $S_{12/12}$. The third group of re-programmable interconnect elements are controlled by the fifteen outputs of third decoder 150, which is driven by active storage elements 28-9 to 28-12. Switches are omitted from positions 1/10, 5/5, and 9/1 to provide for a null address at each of decoders 146, 148, and 150, as previously described.

Figure 7A:
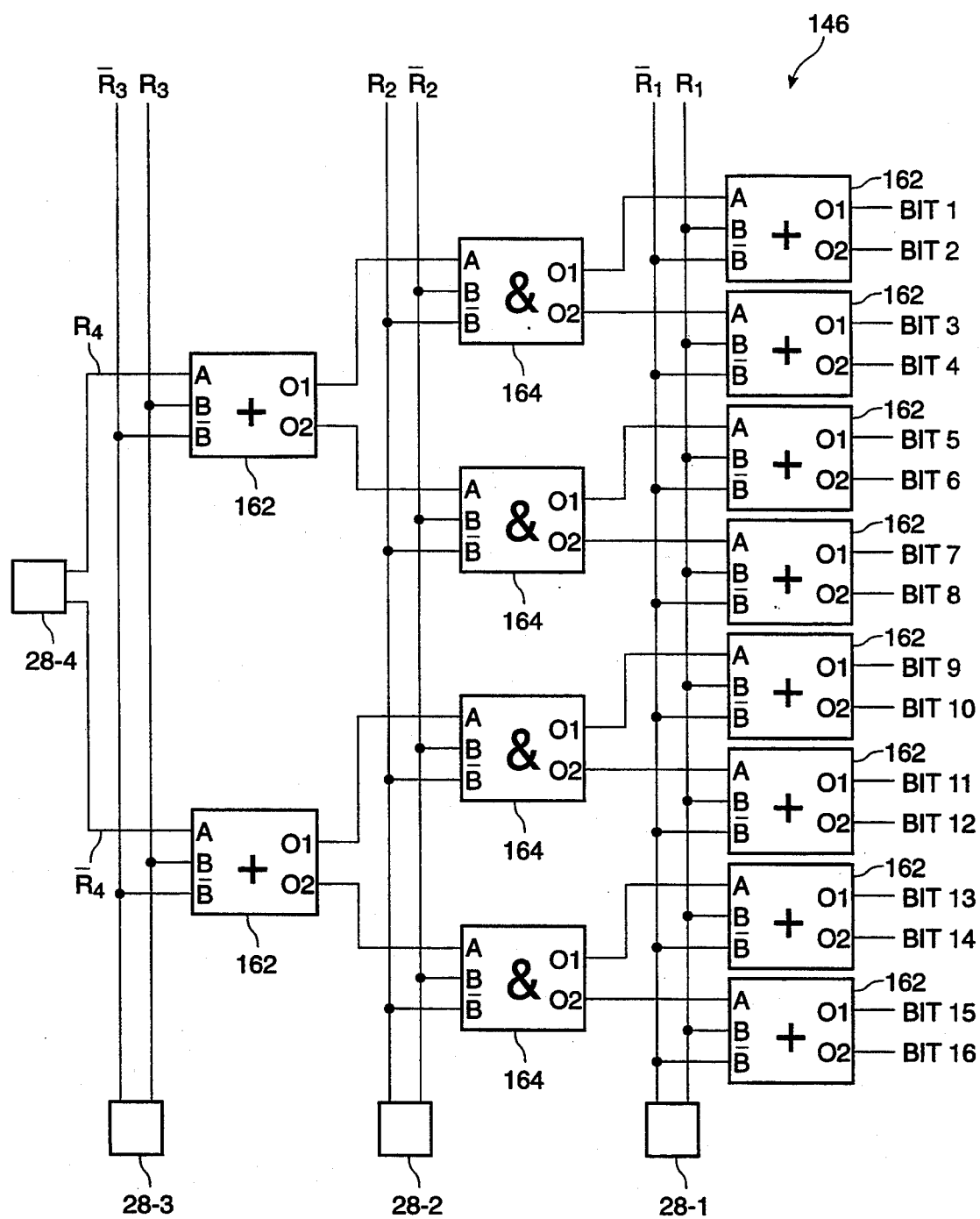
FIG. 7a is a block diagram of a decoder circuit for use in the architecture of FIG. 6.

An example of a circuit for use as decoders 146, 148, and 150 is shown in block diagram form in FIG. 7a. The circuit is comprised of a group of two-input NOR-decode circuits 162 and a group of two-input NAND-decode circuits 164. The NOR and NAND decode circuits are driven by complementary pairs of outputs of the four active storage elements which drive them (active storage elements 28-1 through 28-4 are shown as an example). Those of ordinary skill in the art will recognize that complementary outputs are available from circuits like that shown in FIG. 2. The output signal and its complement are available from the outputs of inverters 32, and 34, respectively. Those of ordinary skill in the art will readily realize that numerous variations of the circuit of FIG. 7a are possible.

Figure 7B:
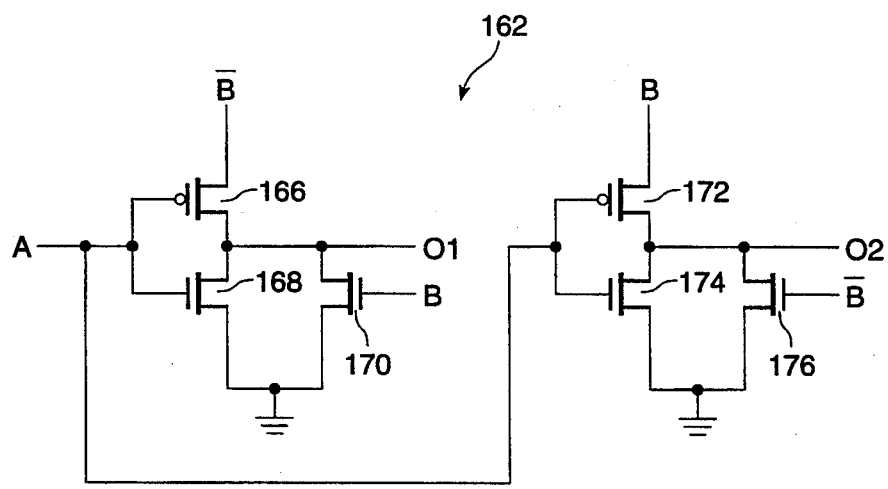
Figure 7C:
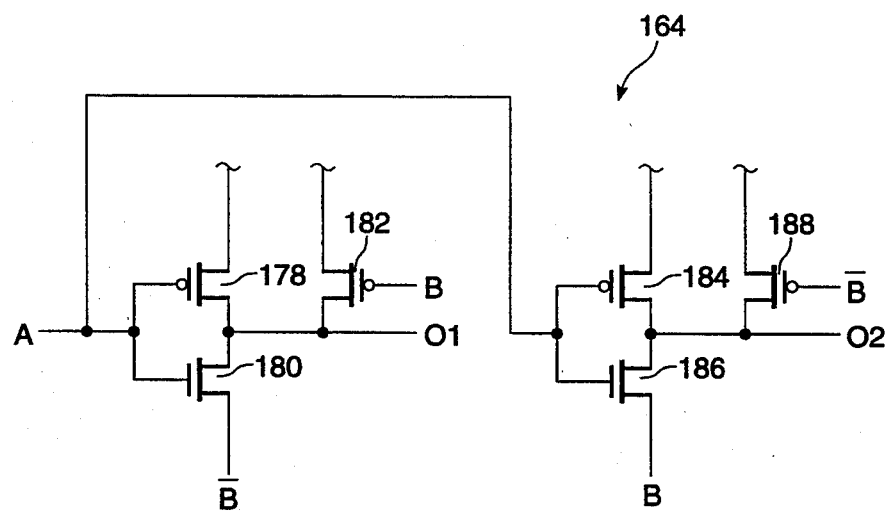

Schematic diagrams of exemplary NOR and NAND decode circuits are shown, respectively, in FIGS. 7b and 7c. Referring now to FIG. 7b, an exemplary two-input NOR circuit 162 is shown in schematic diagram form. In a first section of NOR-decode circuit 162, P-Channel MOS transistor 166 and N-Channel MOS transistor 168 form an inverter, the input of which is the first input (A) to the OR circuit. N-Channel MOS transistor 168 is shunted by N-Channel MOS transistor 170, the gate of which forms the second input (B) to the OR circuit. The source of P-Channel MOS transistor 166 is connected to the complement of the (B) input. The output 01 of NOR-decode circuit 162 is the common drain connection of P-Channel MOS transistor 166 and N-Channel MOS transistor 168.

A second section of NOR-decode circuit 162 is identical to the first section, and comprises P-Channel MOS transistor 172 and N-Channel MOS transistor 174 forming an inverter, the input of which is also connected to the (A) input to the NOR-decode circuit. N-Channel MOS transistor 176 is shunted by N-Channel MOS transistor 170, the gate of which is connected to the complement of the (B) input. The source of P-Channel MOS transistor 166 is connected to the (B) input. The output 02 of NOR-decode circuit 162 is the common drain connection of P-Channel 30 MOS transistor 172 and N-Channel MOS transistor 174.

Referring now to FIG. 7c, an exemplary two-input NAND-decode circuit 162 is shown in schematic diagram form. In a first section of AND circuit 164, P-

Channel MOS transistor 178 and N-Channel MOS transistor 180 form an inverter, the input of which is the first input (A) to the NAND-decode circuit. P-Channel MOS transistor 178 is shunted by P-Channel MOS transistor 182, the gate of which forms the second input (B) to the NAND-decode circuit. The source of N-Channel MOS transistor 180 is connected to the complement of the (B) input. The output 01 of NAND-decode circuit 164 is the common drain connection of P-Channel MOS transistor 178 and N-Channel MOS transistor 180.

A second section of NAND-decode circuit 164 is identical to the first section, and comprises P-Channel MOS transistor 184 and N-Channel MOS transistor 186 forming an inverter, the input of which is also connected to the (A) input to the NAND-decode circuit. P-Channel MOS transistor 184 is shunted by P-Channel MOS transistor 188, the gate! of which is connected to the complement of the (B) input. The source of N-Channel MOS transistor 186 is connected to the (B) input. The output 02 of NAND-decode circuit 164 is the common drain connection of P-Channel MOS transistor 172 and N-Channel MOS transistor 174.

Figure 8:
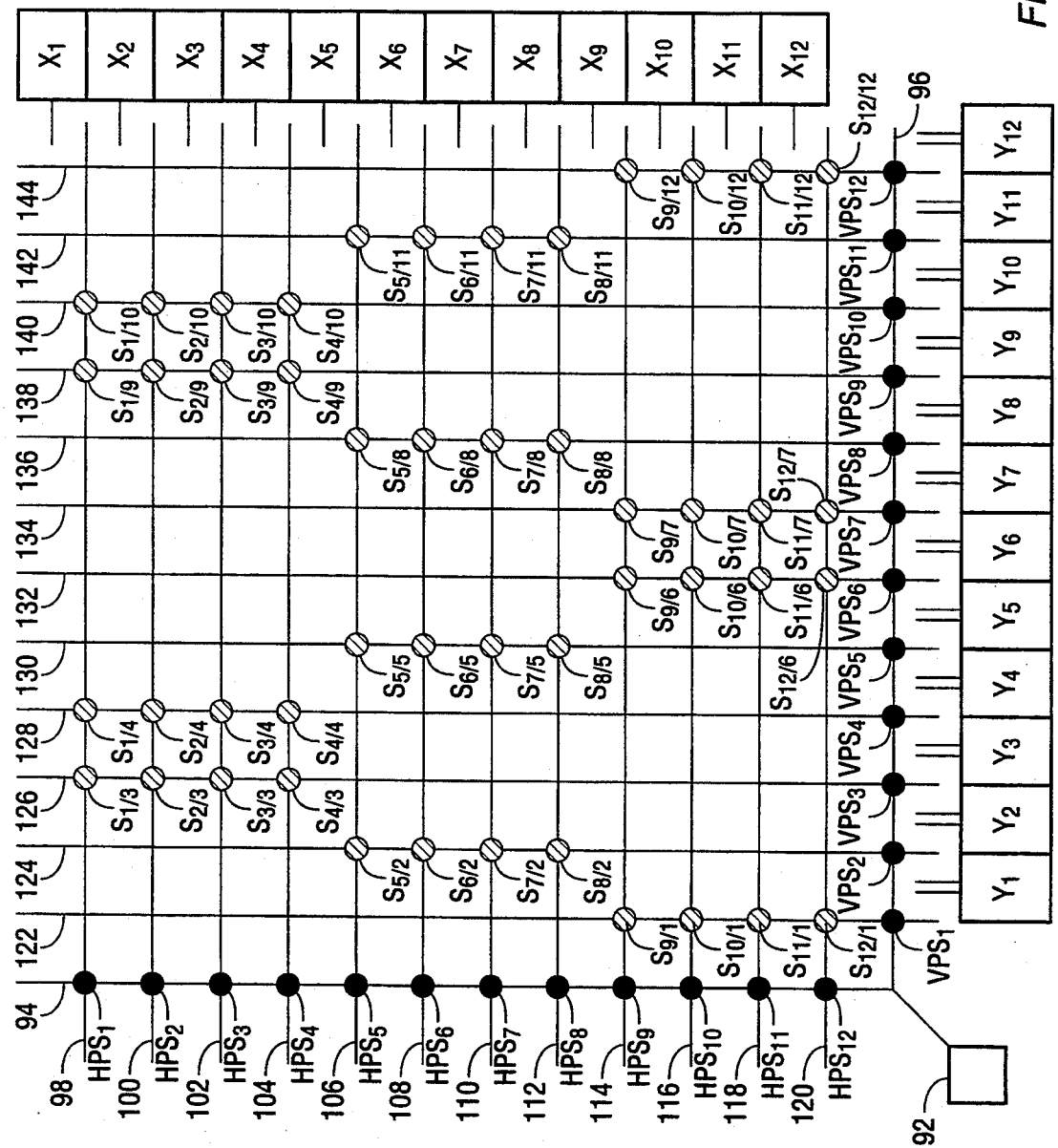
FIG. 8 is a schematic diagram of a portion of a user re-programmable interconnect architecture according to a fourth embodiment of the present invention.

A presently preferred embodiment of a user re-programmable interconnect architecture including multiple I/O connections is depicted in FIG. 8. The switching matrix (sometimes referred to as "channel box") of the embodiment of FIG. 8 is identical to the embodiment of FIG. 6. Elements in FIG. 8 identical to elements in FIG. 6 are given like reference numerals. Therefore, an I/O pad 92 is electrically connected to pad stubs 94 and 96. Pad stubs 94 and 96 are orthogonally oriented to one another. Vertical pad stub 94 is oriented orthogonal to a plurality of horizontal interconnect conductors (12 are shown) 98, 100, 102, 104, 106, 108, 110, 112, 114, 116, 118, and 120. Horizontal pad stub 96 is oriented orthogonal to a plurality of horizontal interconnect conductors (12 are shown) 122, 124, 126, 128, 130, 132, 134, 136, 138, 140, 142, and 144.

The horizontal and vertical interconnect conductors may be connected to the I/O pad 92 through the pad stubs 94 and 96 by user re-programmable interconnect elements. These user-reprogrammable interconnect elements may each be driven by a separate active storage element as is known in the art. According to a presently preferred embodiment of the invention, the intersections of the horizontal interconnect conductors and the vertical pad stub 94 are fully populated by user re-programmable interconnect elements $HPS_1$–$HPS_{12}$, and the intersections of the vertical interconnect conductors and the horizontal pad stub 96 are fully populated by user re-programmable interconnect elements $VPS_1$–$VPS_{12}$.

In addition, the horizontal and ,vertical interconnect conductors may be connected to one another by user re-programmable interconnect elements. Unlike the embodiment of FIG. 6, the intersection matrix formed by the horizontal and vertical interconnect conductors in the embodiment of FIG. 8 are fully populated by user re-programmable interconnect elements. This is made possible by the decoding scheme employed in the embodiment of FIG. 8.

As in the embodiment of FIG. 6, the interconnect elements in the embodiment of FIG. 8 are divided into three groups. The first group includes re-programmable interconnect elements (in a format $S_{x/y}$, where X is the position of the x conductor and Y is the position of the Y conductor) $S_{1/3}$, $S_{1/4}$, $S_{1/9}$ and $S_{1/10}$; $S_{2/3}$, $S_{2/4}$, $S_{2/9}$ and $S_{2/10}$; $S_{3/3}$, $S_{3/4}$, $S_{3/9}$, and $S_{3/10}$; and $S_{4/3}$, $S_{4/4}$, $S_{4/9}$, and $S_{4/10}$. The second group includes re-programmable interconnect elements $S_{5/2}$, $S_{5/5}$ $S_{5/8}$, and $S_{5/11}$; $S_{6/2}$, $S_{6/5}$, $S_{6/8}$, and $S_{6/11}$; $S_{7/2}$, $S_{7/5}$, $S_{7/8}$, and $S_{7/11}$; and $S_{8/2}$, $S_{8/5}$ $S_{8/8}$, and $S_{8/11}$. The third group includes re-programmable interconnect elements $S_{9/1}$, $S_{9/6}$, $S_{9/7}$, and $S_{9/12}$, and $S_{10/1}$, $S_{10/6}$, $S_{10/7}$, and $S_{10/12}$; $S_{11/1}$, $S_{11/6}$, $S_{11/7}$, and $S_{11/12}$; and $S_{12/1}$, $S_{12/6}$, $S_{12/7}$, and $S_{12/12}$. Thus the matrix of 48 possible switch positions is populated by all 48 switches.

However, instead of decoders 146, 148, and 150 as in the embodiment of FIG. 6, the embodiment of FIG. 8 includes twelve X active storage elements $X_1$–$X_{12}$ and twelve Y active storage elements $Y_1$–$Y_{12}$. Thus a total of twenty-four active storage elements are used to directly control 45 user re-programmable interconnect elements via a partial addressing scheme. A selected user re-programmable interconnect element is turned on by storing a high level in its associated X and Y active storage elements. The AND function of the user re-programmable interconnect element may be performed by the circuit of FIG. 5.

Those of ordinary skill in the art will recognize that, while the embodiment of FIG. 8 has been disclosed as a CMOS embodiment, the principles disclosed herein may be employed in a straightforward manner to construct a bipolar transistor embodiment.

Figure 9:
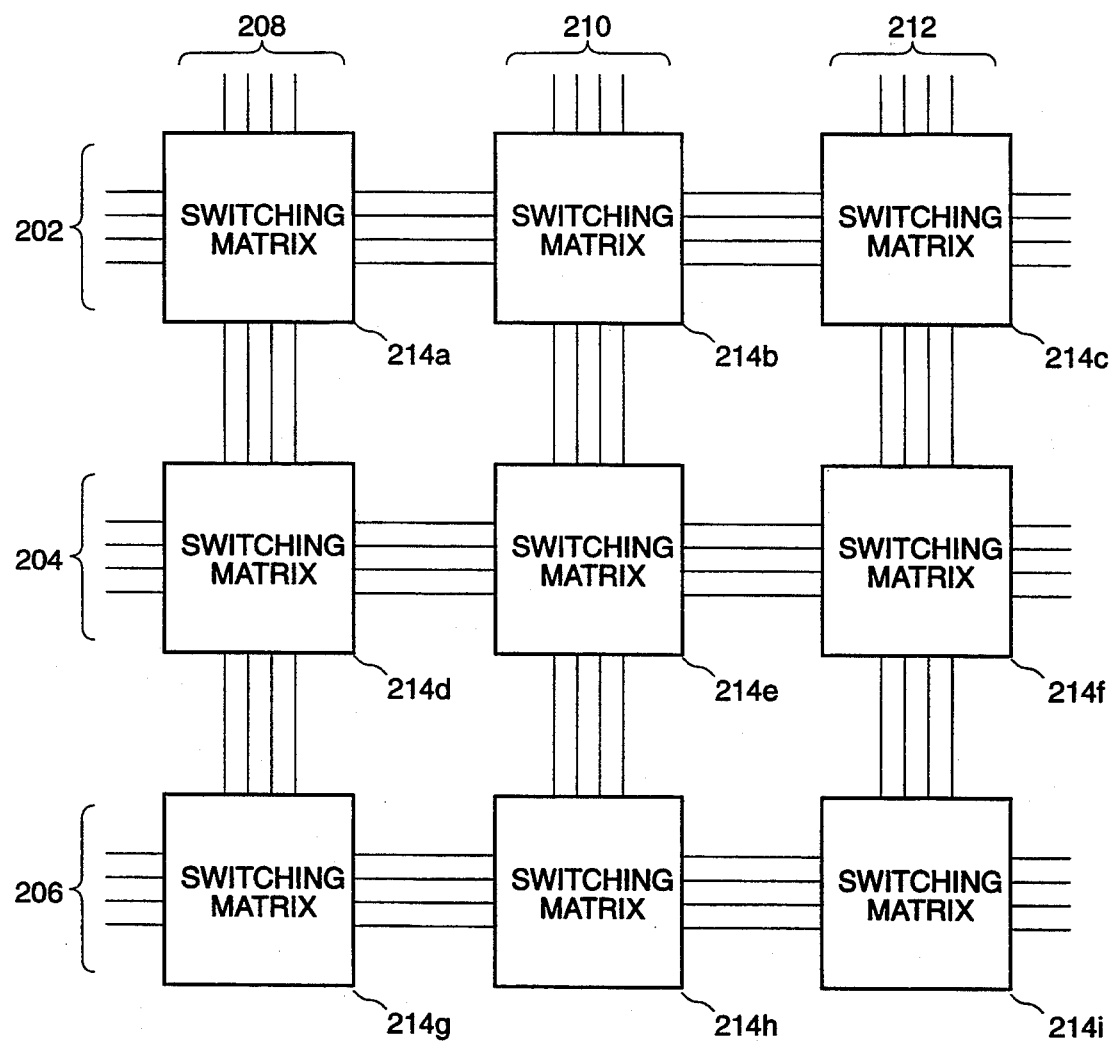
FIG. 9 is a block diagram of a portion of an integrated circuit according to the present invention incorporating the architecture shown in any of FIGS. 3, 4, 6, or 8.

Referring now to FIG. 9, a block diagram of a portion of an integrated circuit incorporating the user re-programmable interconnect architecture according to the present invention is presented. A plurality of groups of horizontal interconnect conductors 202, 204, and 206 and vertical interconnect conductors 208, 210, and 212 intersect at a plurality of switching matrices 214a–214i. Switching matrices 214a–214i may incorporate the architecture shown in any of FIGS. 3, 4, 6, or 8 herein. Those of ordinary skill in the art will recognize that FIG. 9 is merely illustrative, and the fact that it illustrates groups of four horizontal interconnect conductors 202, 204, and 206 and vertical interconnect conductors 208, 210, and 212 and nine switching matrices is not to be taken as a limitation. The principle shown in FIG. 9 may be applied to interconnect arrays of any size.

Figure 10:
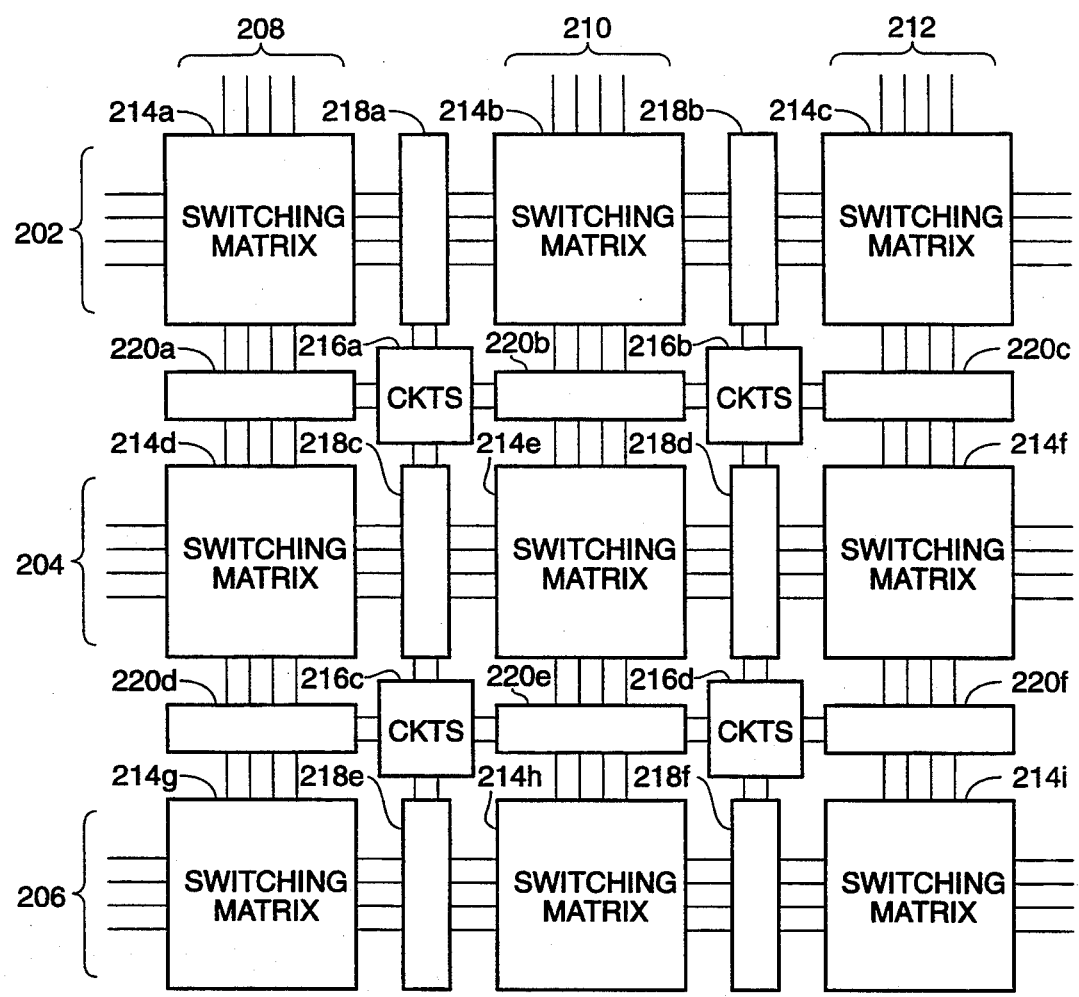
FIG. 10 is a block diagram of a portion of an integrated circuit according to the present invention incorporating the architecture shown in any of FIGS. 3, 4, 6, or 8, incorporating user re-programmable circuitry.

Referring now to FIG. 10, a portion of an integrated circuit containing a user re-programmable interconnect architecture which is a variation of the user re-programmable interconnect architecture of FIG. 9 is shown in block diagram form. As in the embodiment of FIG. 9, a plurality of groups of horizontal interconnect conductors 202, 204, and 206 and vertical interconnect conductors 208, 210, and 212 intersect at a plurality of switching matrices 214a–214i. Switching matrices 214a–214i may incorporate the architecture shown in any of FIGS. 3, 4, 6, or 8 herein.

In addition, circuits 216a–216d are disposed throughout the matrix. As those of ordinary skill in the art will recognize, circuits 216a–216d may comprise fixed circuits of any nature, as well as user programmable circuits, of which there are many known varieties. The inputs and outputs of circuits 216a–216d (a total of four inputs/outputs are shown for each) are connectable to horizontal interconnect conductors 202, 204, and 206 through switching matrices 218a–218f and to vertical interconnect conductors 208, 210, and 212 through switching matrices 220a–220f. Any circuit node in a "CKTS" box may connect to 0 or more of the 218, 220 type switching matrices around it (there are four 218/220 type switching matrices adjacent each "CKTS" box), i.e., a circuit node is not restricted to "come out" on one side only. Switching matrices 218a–218f and 220a–220f may incorporate the architecture shown in any of FIGS. 3, 4, 6, or 8 herein.

Those of ordinary skill in the art will recognize that FIG. 10 is merely illustrative, and the number of conductors, switch matrices, and circuits illustrated therein is not to be taken as a limitation. The principle shown in FIG. 10 may be applied to interconnect arrays of any size.

Figure 11:
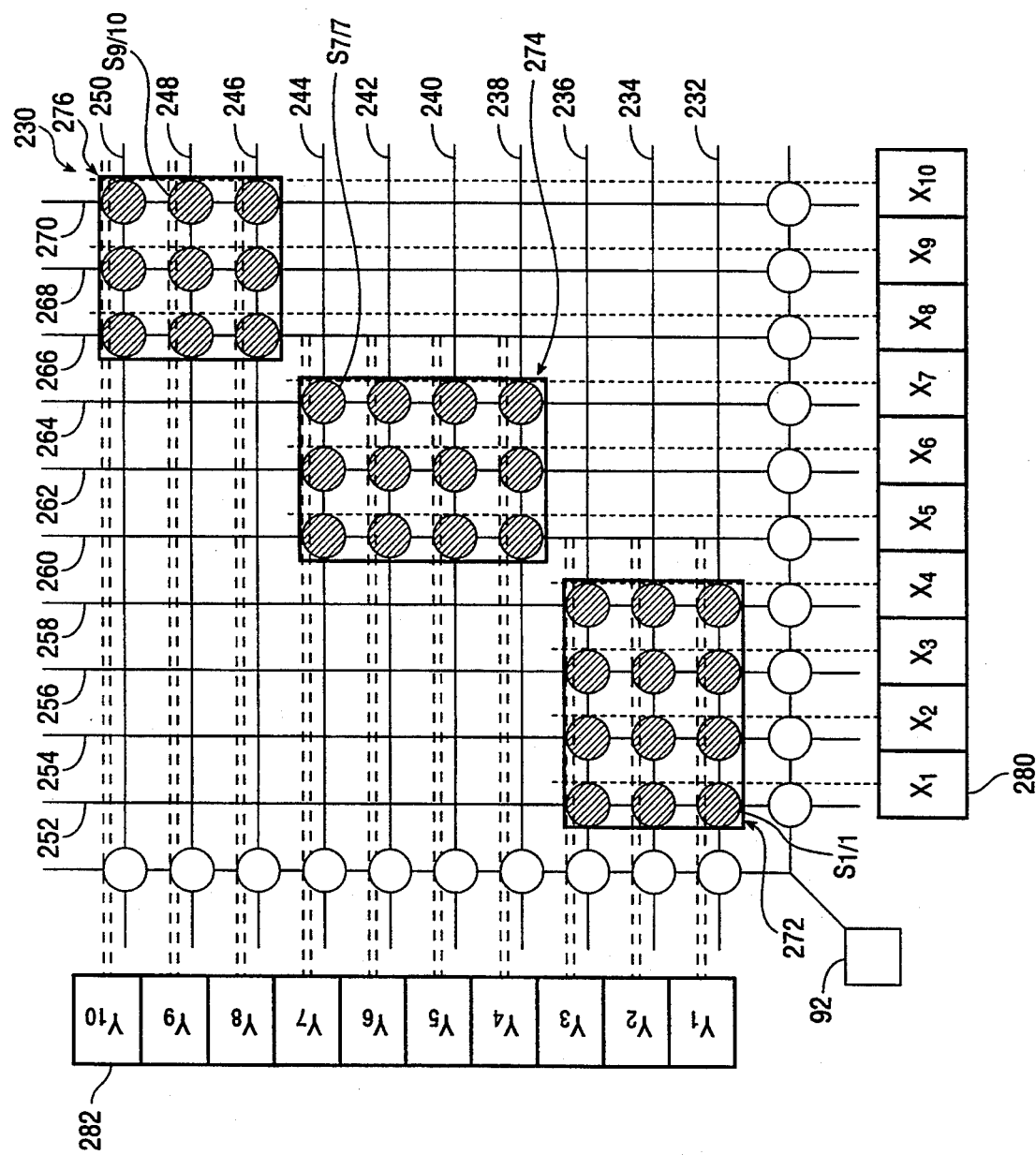
FIG. 11 is a schematic diagram of a portion of a user re-programmable interconnect architecture according to a fourth embodiment of the present invention.

Referring now to FIG. 11 a schematic diagram of a portion of a user re-programmable interconnect architecture as described above is shown. According to this embodiment, the decoder: lines for the switching elements control switching elements on the same interconnect conductors.

As shown in FIG. 11, a switching matrix 230 includes ten horizontal interconnect conductors 232, 234, 236, 238, 240, 242, 244, 246, 248, and 250, and ten vertical interconnect conductors 252, 254, 256, 258, 260, 262, 264, 266, 268, and 270. Switching matrix 230 is populated by a plurality of switching elements located at some of the intersections of the horizontal and vertical interconnect conductors. The switching elements may be conceptualized as comprising three groups of switching elements. The first group of switching elements 272 includes switching elements $S_{1/1}$, $S_{1/2}$, $S_{1/3}$, $S_{1/4}$, $S_{2/1}$, $S_{2/2}$, $S_{2/3}$, $S_{2/4}$, $S_{3/1}$, $S_{3/2}$, $S_{3/3}$, and $S_{3/4}$. The second group of switching elements 274 includes switching elements $S_{4/5}$, $S_{4/6}$, $S_{4/7}$, $S_{5/5}$, $S_{5/6}$, $S_{5/7}$, $S_{6/5}$, $S_{6/6}$, $S_{6/7}$, $S_{7/5}$, $S_{7/6}$, and $S_{7/7}$. The third group of switching elements 276 includes switching elements $S_{8/8}$, $S_{8/9}$, $S_{8/10}$, $S_{9/8}$, $S_{9/9}$, $S_{9/10}$, $S_{10/8}$, $S_{10/9}$, and $S_{10/10}$.

Each of the switching elements may be controlled by a circuit such as the one shown in FIG. 5. Those of ordinary skill in the art will note that two decoder signals are required in one direction (i.e., horizontal) and a single decoder signal is required in the other direction (i.e., vertical). Such persons will further note that, in the embodiment of FIG. 11, the single decoder signals for the first, second and third groups of switching elements are supplied from the X decoders 280 and that the two decoder signals for the first, second and third groups of switching elements are supplied from the Y decoders 282.

Figure 12:
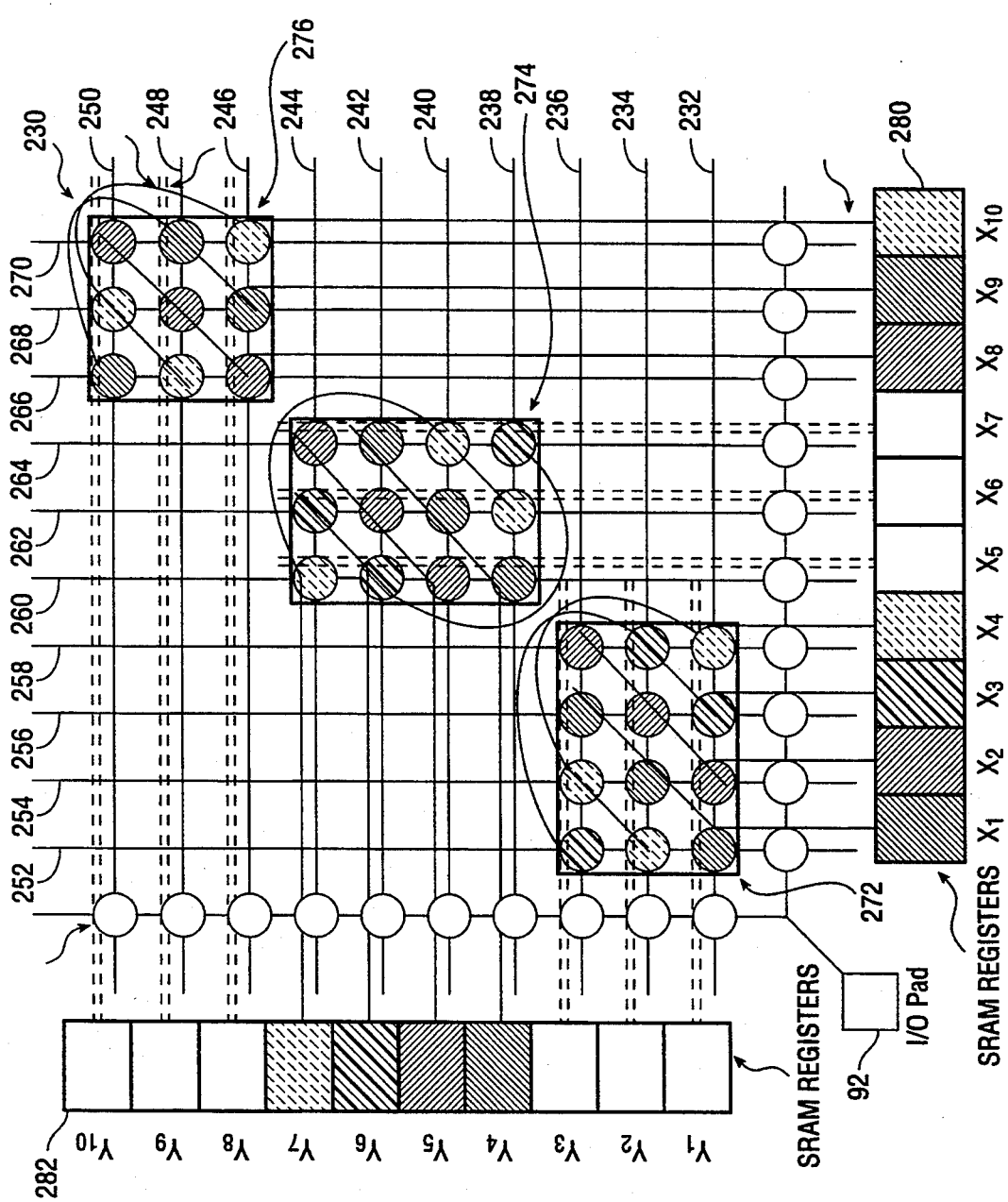
FIG. 12 is a schematic diagram of a portion of a user re-programmable interconnect architecture according to a fifth embodiment of the present invention.

Referring now to FIG. 12 a schematic diagram of a portion of a user re-programmable interconnect architecture according to a fifth embodiment of the present invention is shown. In the previously disclosed embodiments herein, the decoder lines for the switching elements controlled switching elements on the same interconnect conductors. For example, in the architecture illustrated in FIG. 4, decoder line pair 64 is connected to switching elements $S_1$, $S_2$, and $S_3$ which are all connected to horizontal interconnect conductor 10. In the embodiment of the present invention depicted in FIG. 12, the decoder lines for the switching elements control switching elements on different interconnect conductors.

As shown in FIG. 12, a switching matrix 230 includes ten horizontal interconnect conductors 232, 234, 236, 238, 240, 242, 244, 246, 248, and 250, and ten vertical interconnect conductors 252, 254, 256, 258, 260, 262, 264, 266, 268, and 270. The matrix 230 is populated by a plurality of switching elements located at the intersections of the horizontal and vertical interconnect conductors. The switching elements may be conceptualized as comprising three groups of switching elements. The first group of switching elements 272 includes switching elements $S_{1/1}$, $S_{1/2}$, $S_{1/3}$, $S_{1/4}$, $S_{2/1}$, $S_{2/2}$, $S_{2/3}$, $S_{2/4}$, $S_{3/1}$, $S_{3/2}$, $S_{3/3}$, and $S_{3/4}$. The second group of switching elements 274 includes switching elements $S_{4/5}$, $S_{4/6}$, $S_{4/7}$, $S_{5/5}$, $S_{5/6}$, $S_{5/7}$, $S_{6/5}$, $S_{6/6}$, $S_{6/7}$, $S_{7/5}$, $S_{7/6}$, and $S_{7/7}$. The third group of switching elements 276 includes switching elements $S_{8/8}$, $S_{8/9}$, $S_{8/10}$, $S_{9/8}$, $S_{9/9}$, $S_{9/10}$, $S_{10/8}$, $S_{10/9}$, and $S_{10/10}$.

Each of the switching elements may be controlled by a circuit such as the one shown in FIG. 5. Those of ordinary skill in the art will note that two decoder signals are required in one direction (i.e., horizontal or vertical) and a single decoder signal is required in the other direction. Such persons will further note that, in the embodiment of FIG. 12, the single decoder signals for the first and third groups of switching elements 272, 276 are supplied from the X decoders 280 and that the two decoder signals for the second group of switching elements 274 are also supplied from the X decoders 280. Accordingly, the single decoder signals for the second group of switching elements 274 are supplied by the Y decoders 282 as are the two decoder signals for the first and third groups of switching elements 272, 276. The two decoder signals mentioned above are complementary.

Figure 13A:
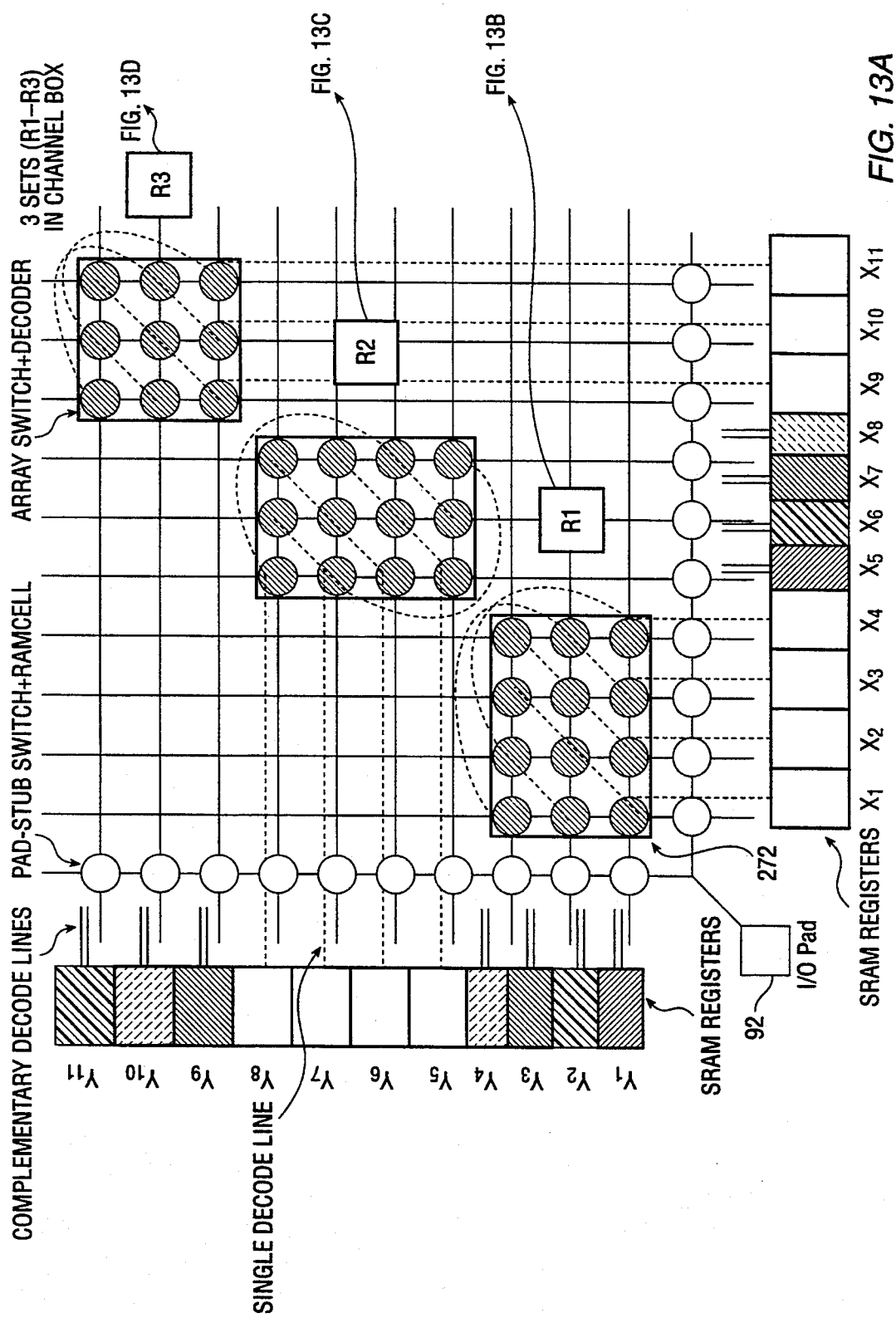
FIG. 13A is a schematic diagram of a portion of a user re-programmable interconnect architecture according to a sixth embodiment of the present invention.
Figure 13B:
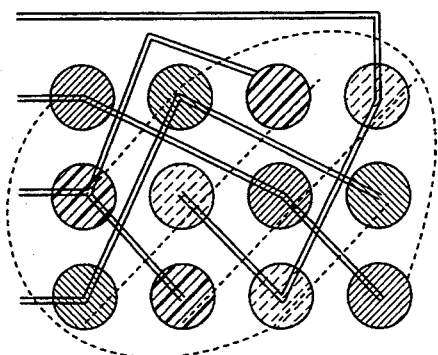
FIG. 13B is a schematic diagram showing the decoder line routing for switch group "R1" of FIG. 13A.
Figure 13C:
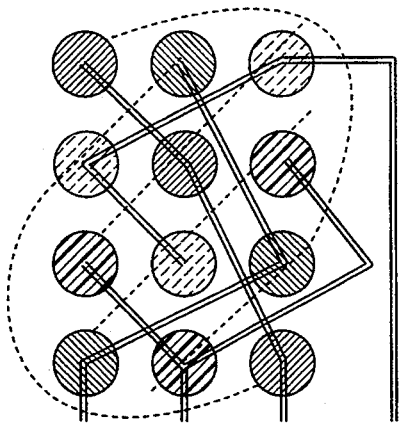
FIG. 13C is a schematic diagram showing the decoder line routing for switch group "R2" of FIG. 13A.
Figure 13D:
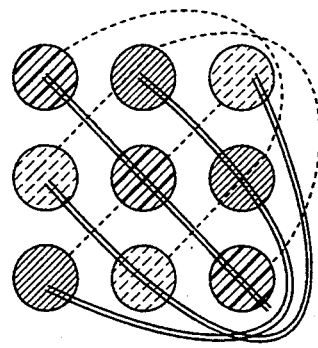
FIG. 13D is a schematic diagram showing the decoder line routing for switch group "R3" of FIG. 13A.

A further improvement over the fifth preferred embodiment is shown in FIGS. 13A–13D. FIG. 13A is similar to FIG. 12 except that complementary non-parallel decode lines are implemented so that both sets of decode lines are non-parallel. (The term "non-parallel decoder line" as used herein refers to a decoder line the switching elements of which are not all located on a common interconnect line. In other words, a particular decoder line may be associated with 10 switching elements; likewise, an interconnect line may also be associated with 10 switching elements; a decoder line in a "non-parallel" relationship with the interconnect line might have 1, 2, etc. but not 10 switching elements in common; a decoder line in a "parallel" relationship with the interconnect line would have all 10 switching elements in common). This has the effect of further increasing the routability of the architecture. The purpose of these last described embodiments of the present invention is to improve the routability of the architecture by increasing the maximum number of implementable or creatable independent nets per set of switches, with no increase in ramcells or decoders in the case of an n×m group where n=m (for an n×m rectangular array of switches where n<m, this embodiment increases the ramcell count by m−n over the FIG. 12 embodiment). The improvement may also be manifested as a reduction in the number of tracks (or switches) while retaining prior routability, resulting in use of less die layout area. Using this invention routability may be further increased by introducing a few additional ramcells.

Where the switches controlled by a decoder are all on one track (generally in the direction of the decoder line) routability is limited by comparison to the fifth and sixth preferred embodiments of the present invention. This is due to the way in which the decoder lines are run.

If horizontal/vertical decoder lines are run to control switches on multiple horizontal/vertical tracks (conductors) so that no two switches on a decoder line are in the same row or column (in a given set of switches), the number of nets per set of switches as shown in FIG. 11 is increased. This increased routability is shown in FIG. 12. In the FIG. 12 embodiment (fifth preferred embodiment) each decoder has a "single" decode line in one direction and two complementary decode lines in the perpendicular direction. In FIG. 12 (unlike as shown in FIG. 11) these decoder lines do not always run in the same direction. In FIG. 12 each single decode line is designed to cross multiple tracks in its direction. Thus, on a single decode line within a set, no two switches are in the same row or column. This means that all of the tracks switched by the switches this decode line controls do not intersect (or coincide) within the set of switches. This is the desired general property of these decoder lines for this embodiment.

The complementary decode lines of FIG. 12 do not have this property. Within a set of switches (e.g., 272, 274, or 276) the switches are shown as circles having various shading. The switches having the same shading are all connected to the same non-parallel decoder lines. For conceptual purposes continuous decode lines (for $X_1-X_4$; $X_8-X_{10}$; and $Y_4-Y_7$) are shown controlling these switches, though their physical layout need not be similar. Note that in the second set of switches "R2" (274), $Y_4-Y_7$ are used as the non-parallel decode lines since $X_5-X_7$ cannot meet the requirement stated above, e.g., that on a single decoder line within a set, no two switches are in the same row or column.

Accordingly, within a set of switches, one or more of the switches on one non-parallel decoder line can be on simultaneously. This is done by setting that decoder line high, and one or more of the complementary lines (at switches along the non-parallel line) also high, e.g., $X_2$ and $Y_1$, $Y_2$ or $Y_3$; $X_7$ and $Y_4$, $Y_6$ or $Y_7$, etc. The above switching matrix could implement up to nine nets where previously, as shown in FIG. 11, the maximum routability was three nets. The number of ramcells and decoders in both embodiments is the same. The only difference is the physical routing of the decoder lines. If $n_s$ denotes the number of maps corresponding to different nets (where all maps implementing the same net count as one) in a set of switches S, then in the switching matrix depicted in FIG. 11, the total number of maps is given by:

$$\left(n_{R1} = \sum_{i=0}^{n_0} \binom{N_{R1}}{i}\right)\left(n_{R2} = \sum_{i=0}^{n_0} \binom{N_{R2}}{i}\right)\left(n_{R3} = \sum_{i=0}^{n_0} \binom{N_{R3}}{i}\right) = (13)(13)(10) = 1690 \quad \text{(EQ. 1)}$$

Using the same notation, with $n_o=3$ for all sets, in FIG. 12 the total number of maps is given by:

$$\left(n_{R1} = 1 + 4\sum_{i=1}^{n_0}\binom{3}{i}\right)\left(n_{R2} = 1 + 4\sum_{i=1}^{n_0}\binom{3}{i}\right)\left(n_{R3} = 1 + 3\sum_{i=1}^{n_0}\binom{3}{i}\right) = (29)(29)(22) = 18502 \quad \text{(EQ. 2)}$$

Thus, just rerouting the decoder lines in a single direction, with no additional circuitry, yields an improvement in the routability given by an increase in the number of implementable independent maps from 1690 to 18502 or 1095%.

In general, in a set of switches (an $n \times m$ rectangle of switches where $n \leq m$) using the above scheme, m non-parallel decoder lines (each controlling n switches satisfying the requirement stated above, e.g., that on a single decoder line within a set, no two switches are in the same row or column) would exist. Thus the number of maps from set $S_{n \times m}$ (taken by itself) is given by:

$$\left(n_{S_{n \times m}} = = 1 + m\sum_{i=1}^{n}\binom{n}{i}\right) = (1 + m(2^n - 1)) \quad \text{(EQ. 3)}$$

which is far more than:

(EQ. 4) $n_{s_{n \times m}} = 1 + nm$ which is the routability achieved using the architecture of FIG. 11. The improvement in routability increases as $n \times m$ increases, particularly for increases in n.

Since EQ. 3 is exponential in n, the most maps (given $n \times m$ =constant) are addressed when n is as large as possible, i.e., when n=m. This is true for the FIG. 11 embodiment as well since for constant $n \times m$, n+m is minimized when n=m. So to maximize routability, the $n \times m$ rectangle should be as "square" as possible (e.g., $6 \times 5$ is preferred over $10 \times 3$ or $15 \times 2$ in a 30 switch rectangle).

It is also to be noted that the positions of the horizontal tracks (with switches, associated decoder line and ramcell) in the FIG. 11 or FIG. 12 embodiments (not the FIG. 13A embodiment discussed below) may be arbitrarily rearranged (e.g., $X_1$ and $X_7$, $X_3$ and $X_8$, $X_2$ and $X_5$, and $X_4$ and $X_{10}$, etc. may be swapped). The same is also true for the vertical tracks. Thus, to facilitate layout, switches and decoders can be more regularly distributed within the switching matrix. These permutations will not, however, affect routability.

An interesting property of the decoding architectures discussed above is that partial depopulation of switches within the switching matrix actually increases the total number of independent nets which can be created. While this may initially seem contradictory, after an initial switch is turned on, multiple switches may also be turned on by enabling a pair of decoder lines. A sparser switch distribution has fewer switches to "get in the way" and cause loop nets or unintentional nets (usually undesirable), and ultimately allows for more possible independent nets to be built on the same number of switches. Of course, as a practical matter, it is also desirable to have as many possible "first choices" for the first switch with decreasing numbers of available switches for the second, third, etc. Thus it is only advantageous to depopulate the switches moderately within the switching matrix. For this application, it is presently preferred to depopulate the switches within a range of about 25% to about 75%. Referring to FIGS. 11 and 12, the switching matrices depicted in those figures are 100% populated, i.e., have $10 \times 10$ switches, Alternatively, some subset of the $10 \times 10$ area of switches could be populated by a number of rectangles of switches. Table I shows the relative routability in comparison to the depopulation used, starting with a $10 \times 10$ channel box:

TABLE I

| Population | Figure 11 Embodient | | Figure 12 Embodiment | | Both Types |
| --- | --- | --- | --- | --- | --- |
| | Max. No. of Switches | No. Maps/ Switch Matrix | Max No. of Switches | No. Maps/ Switch Matrix | No. 1st Choices |
| 100%(10 × 10) | 1 | 101 | 10 | 10231 | 100 |
| 62%(3 × 2, 7 × 8) | 2 | 399 | 9 | 10170 | 62 |
| 50%(5 × 5, 5 × 5) | 3 | 676 | 10 | 24336 | 50 |
| 24%(3 × 2, 3 × 2, 2 × 3) | 4 | 2401 | 8 | 10000 | 24 |

Thus, there is an advantage in moderately depopulating from 100%, particularly with non-parallel decoder lines as shown in FIG. 12. But, for low switch populations, Table I shows that the number of switches available as "first choices" necessarily decreases as the switching matrix is depopulated which provides a disincentive to severely depopulate the switching matrix.

While using non-parallel decoder lines in one direction has been shown to be useful, it turns out that using non-parallel decoder lines in both directions of a two-dimensional switch matrix can be even more useful in increasing routability. There is a cost, however, in that some additional ramcells may need to be included if n×m rectangles where n¢m are used. The constraint that governs this sixth preferred embodiment of the present invention is that a decoder line in one direction (e.g., X) cannot control more than one switch on a given decoder line in the other (e.g., Y) direction. This ensures that the choice of a new X and Y turn on exactly one additional switch, avoiding loops and multiple net creation which is generally seen as undesirable.

Turning now to FIG. 13A, a decoder architecture with non-parallel decoder lines in both X and Y directions is shown. FIG. 13A shows the non-parallel (single) line architecture of FIG. 12 modified to allow complementary non-parallel decoder lines in both X and Y directions. The addition of 2 ramcells (here $Y_4$ and $X_8$ is necessary to satisfy the requirement set forth above that a decoder line in one direction (e.g., X) cannot control more than one switch on a given decoder line in the other (e.g., Y) direction. In FIG. 13A, the registers driving the new complementary non-parallel decoder lines are shaded; within a set, all switches on the same complementary decoder line are shaded the same.

EQ. 3 and EQ. 4 showed the total number of maps per n×m rectangle for the architecture of FIGS. 12 and 11 respectively. In the FIG. 13A embodiment, in general, for an n×m rectangle adding m−n ramcells will make it "square" increasing the number of possible maps to:

$$n_{S_n \times m} = 1 + m\left(2 \sum_{i=1}^{n} \binom{n}{i} - 1 + (m-n)\right) = \quad \text{(EQ. 5)}$$

$$(1 + m(2^{n+1} + m - n - 3))$$

EQ. 5 gives a result approximately double that of EQ. 3. If m−n>0, in theory this cannot be done with less than one additional ramcell, though more would be inefficient. Since the number of added ramcells=(m−n), m−n should be as small as possible. This leads to the conclusion that a square shaped switch set is optimal. Thus in the square labeled R3 on FIG. 13A, doubling of the address space is achieved with no additional cells—merely by rerouting the decoder lines so that they are non-parallel. If all of the sets had the same number of decode lines in X and Y (i.e., they are "square"), no additional ramcells would be required in order to meet the requirement for implementation of the FIG. 13A architecture.

The number of maps per switching matrix in FIG. 13A is given by:

$$(EQ. 6) \ (n_{R1}=57)(n_{R2}=57)(n_{R3}=40) = 129960$$

Compared with the result from the FIG. 11 embodiment (EQ. 1) of 1690, the FIG. 12 embodiment (EQ. 2) of 18502, this is a significant gain in routability at low cost. The addition of two additional ramcells would normally have only quadrupled the routability given by EQ. 2, however, the increase is by a factor of more than seven. This is because the switch patterns addressed by the scheme of FIG. 13A result in more independent nets, due to the non-parallel decoder lines in both directions. The unusable addresses (loops or multiple nets) of the FIG. 12 embodiment now address usable independent nets; the degenerate addresses or "slack" in the FIG. 12 embodiment are reduced by having the complementary decoder lines not address switches in the same row or column, or on the same decoder line.

Within a set, the increase in the number of maps may be seen as follows. In a set of switches, e.g., "R1" in FIG. 13A, assume that one has chosen to turn on a switch (for example, the lowest left switch in the array, at the $X_1$, $Y_1$ decoder line intersection). Using the FIG. 11 embodiment no more nets in R1 can now be created, i.e., the maximum number of nets is one. Using the FIG. 12 embodiment, up to two more nets may be created (by turning on any of the switches along decoder line $X_1$ in FIG. 12), thus the maximum number of nets is three. However, using the FIG. 13A embodiment, five additional possible choices now exist—other (2) switches along $X_1$, other (2) switches along $Y_1$, or the single switch at the intersection of the $X_2$ and $Y_3$ decoder lines (since $X_1$ & $Y_3$ and $Y_1$ & $X_2$ meet at no switch). This increase in the number of 2nd choices causes the increase in the number of possible maps.

Figure 14:
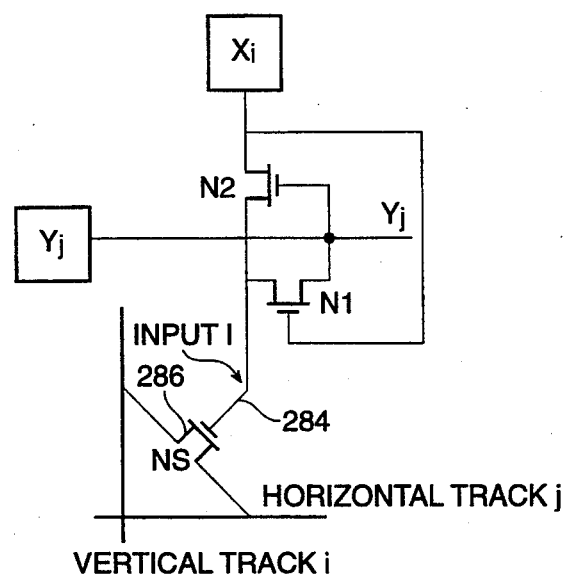
FIG. 14 is a schematic diagram of a 2-line "and" decoder architecture.

A further improvement is now possible to decrease the physical routing of decoder lines. Use of the switch configuration of FIG. 5 necessitates having complementary decoder lines for all but the 1st decoder line when two decoder lines control a switch. Thus two lines must be rerouted (with multiple crossings) in FIG. 12. However the circuit in FIG. 14 implements an "and" decode like FIG. 5 with single decode lines only. By using an extra supply $V_{yy}$ at −1 VDC in addition to $V_{ss}$ of 0 VDC and $V_{pp}$ (preferably an on-board charge-pump supply at about +8 VDC) so that X and Y are at $V_{pp}$ when high and at $V_{cc}$ and $V_{yy}$ respectively when low, it is ensured that gate 284 of transistor 286 is low unless both X and Y are high (the "and" decode). In this case, gate 284 of transistor 286 is one $V_{TN}$ (transistor threshold voltage—about 1.5 VDC) below $V_{pp}$ (approximately 6.5 VDC in this example). With this decoder, the complementary decoder lines in the previous examples (FIGS. 11, 12, and 13A) would be replaced by single decoder lines thus greatly reducing the routing area in FIGS. 11, 12 and 13A.

Patent applications Ser. Nos. 07/913,692 "Memory Cell with Known State on Power Up", now U.S. Pat. No. 5,257,239; 07/900,241 "High Voltage Random-Access Memory Cell Incorporating Level Shifter", now U.S. Pat. No. 5,239,503; and 08/002,776 "Static Random Access Memory Cell With Single Logic-High Voltage Level Bit-Line and Address-Line Drivers", now U.S. Pat. No. 5,301,147 teach improved methods of implementing memory cells useable herein and are hereby incorporated herein by reference.

The non-parallel decoder line architecture may be expanded. The general principal is to have the decoder lines (or bit-lines in the case of non-decoding architectures) control switches which do not control a common track (conductor). When using non-parallel decoder lines in both directions, no two switches in a set of switches should have the same address if routability is to be maximized. Thus routability is increased in a region with no additional resources being used.

For example, in a decoding scheme where an $n \times m$ rectangle of switches with $n \leq m$ is controlled by three banks of registers X, Y and Z of respective sizes x, y and z, three decoder lines are used to control each switch with a three bit and-decoder. Thus, all three decoder lines must be high in order to turn on the switch. This may be accomplished by having several two dimensional switching matrices with X and Y registers operating as discussed above and a Z register for selecting one of the switching matrices. The best use of this address space is achieved when $n^2 = xyz$. If that is not possible or practical, $xyz - n^2$ should preferably be minimized. It is also desirable to pick one of x, y or z to be a perfect square so, for example, $z = k^2$ where k is an integer. Thus a $k \times k$ square array of arrays of switches may each be decoded as in FIGS. 13A–13D. In this case it is possible to make the x, y address of each of these $k^2$ arrays identical and further decode in Z with the additional use of three-bit decoders at each switching element. Thus each switch in a given one of the $k^2$ arrays will be addressed by the same Z decoder line; no two different ones of those $k^2$ arrays would use the same decoder line. The advantage here is that xyz switches are addressed with $x + y + z$ ramcells for a gain in routability particularly for large values of x, y and z. At most the maximum of x, y and z switches can be turned on simultaneously in the $n \times m$ array.

If Q (an integer greater than three) registers were to be used to control an $n \times m$ (where $n \leq m$) rectangular array of switches, a Q bit decoder would be required at each switch element. For large values of Q this would provide some disincentive to further increasing the decoder size since it takes up space on the chip. However, further increases in routability can be achieved with $Q > 3$ registers if no two switches have the same Q-bit address and no two switches on a given decoder line are connected to the same track.

The use of the architecture of the present invention represents an improvement over the prior art. By employing the architecture of the present invention, smaller layout areas, higher speeds, and reduced transistor counts are achieved. Fewer peripheral registers are needed for programming the SRAM cells which drive the switches. No significant loss of routability is suffered and indeed, routability may be significantly increased over prior art architectures.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A user re-programmable interconnect architecture comprising:
    a plurality of interconnect conductors;
    an $I \times J$ array of N user re-programmable interconnect elements connected between different selected ones of said plurality of interconnect conductors, where I, J and N are integers and $I + J$ is greater than 2, each of said user re-programmable interconnect elements being switchable between an on state and an off state in response to the state of a control signal;
    M active storage elements, each having a first unselected state and a second selected state, where M is an integer and $M < N$;
    a decoder having M inputs connected to outputs of said active storage elements and having N outputs, each of said outputs providing a control signal to one of said N user re-programmable interconnect elements, said control signal having an on state and an off state, and wherein the state of each control signal is a function of the state of the M inputs of said decoder.

2. The user re-programmable interconnect architecture of claim 1 wherein a selected state of the M inputs of said decoder causes each control signal from said decoder to assume said off state.

3. A user re-programmable interconnect architecture comprising:
    a plurality of interconnect conductors;
    N user re-programmable interconnect elements connected between different selected Ones of said plurality of interconnect conductors, where N is an integer, each of said user re-programmable interconnect elements being switchable between an on state and an off state in response to the state of a control signal:
    M active storage elements, each having a first unselected state and a second selected state, where M is an integer and $M < N$;
    a decoder having M inputs connected to outputs of said active storage elements and having N outputs, each of said outputs providing a control signal to one of said N user re-programmable interconnect elements, said control signal having an on state and an off state,
    wherein the state of each control signal is a function of the state of the M inputs of said decoder, a selected state of the M inputs of said decoder means causes each control signal from said decoder to assume said off state, and wherein said active storage elements comprise SRAM cells, said user re-programmable interconnect elements comprise MOS transistors, and said decoder comprises a one of N decoder circuit.

4. A user re-programmable interconnect architecture comprising:
    a plurality of interconnect conductors;
    N user re-programmable interconnect elements connected between different selected ones of said plurality of interconnect conductors, where N is an integer, each of said user re-programmable interconnect elements being switchable between an on state and an off state in response to the state of a control signal;

M active storage elements, each having a first unselected state and a second selected state, where M is an integer and $M<N$;

a decoder having M inputs connected to outputs of said active storage elements and having N outputs, each of said outputs providing a control signal to one of said N user re-programmable interconnect elements, said control signal having an on state and an off state, wherein the state of each control signal is a function of the state of the M inputs of said decoder, a selected state of the M inputs of said decoder means causes each control signal from said decoder to assume said off state, and wherein said active storage elements comprise SRAM cells, said user re-programmable interconnect elements comprise MOS transistors, and said decoder comprises a two-bit decoder circuit.

5. A user re-programmable interconnect architecture comprising:

a plurality of interconnect conductors;

N user re-programmable interconnect elements connected between different selected ones of said plurality of interconnect conductors, where N is an integer, each of said user re-programmable interconnect elements being switchable between an on state and an off state in response to the state of a control signal;

M active storage elements, each having a first unselected state and a second selected state, where M is an integer and $M<N$;

a decoder having M inputs connected to outputs of said active storage elements and having N outputs, each of said outputs providing a control signal to one of said N user re-programmable interconnect elements, said control signal having an on state and an off state, wherein the state of each control signal is a function of the state of the M inputs of said decoder, a selected state of the M inputs of said decoder means causes each control signal from said decoder to assume said off state, and wherein said active storage elements comprise SRAM cells, said user re-programmable interconnect elements comprise MOS transistors, and said decoder comprises a more than two-bit decoder circuit.

6. A user re-programmable interconnect architecture comprising:

a plurality of interconnect conductors comprising a group of interconnect conductors;

N user re-programmable interconnect elements connected between different selected ones of said plurality of interconnect conductors in said group, where N is an integer, each of said user re-programmable interconnect elements being switchable between an on state and an off state in response to the state of a control signal;

a decoded/driver for decoding input signals associated with each of said user re-programmable interconnect elements, each of said decoder/drivers having a first input, a second input and an output, said output connected to a single associated user re-programmable interconnect element, for driving said single associated user re-programmable interconnect element in response to signals at said first and second inputs;

$M_1$ first active storage elements, each having a first unselected state and a second selected state available at an output thereof, where $M_1$ is an integer, the output of each of said first active storage elements connected to the first inputs of a different subset of said decoder/drivers;

$M_2$ second active storage elements, each having a first unselected state and a second selected state available at an output thereof, where $M_2$ is an integer, the output of each of said second active storage elements connected to the second inputs of a different subset of said decoder/drivers such that the first and second inputs of each of said decoder/drivers are connected to the outputs of one each of said first and second active storage elements; and wherein each of said decoder/drivers will switch said single associated user re-programmable interconnect element to its on state in response to said selected state outputs appearing at both its first and second inputs, and wherein $M_1+M_2<N$.

7. The user re-programmable interconnect architecture of claim 6 wherein said active storage elements comprise SRAM cells, said user re-programmable interconnect elements comprise MOS transistors, and said decoder/drivers comprise ANDing circuits.

8. The user re-programmable interconnect architecture of claim 6 wherein said decoder/drivers comprises:

a first group of decoder lines each one of which is connected to one of the outputs of said first active storage elements;

a second group of decoder lines each one of which is connected to one of the outputs of said second active storage elements.

9. The user re-programmable interconnect architecture of claim 8 wherein said first group and said second group of decoder lines are single line decoder lines.

10. The user re-programmable interconnect architecture of claim 9 wherein said active storage elements comprise SRAM cells, said user re-programmable interconnect elements comprise MOS transistors, and said decoder/drivers comprise ANDing circuits.

11. The user re-programmable interconnect architecture of claim 8 wherein said first group of decoder lines are in non-parallel relationship with said interconnect conductors.

12. The user re-programmable interconnect architecture of claim 10 wherein said first group of decoder lines are in non-parallel relationship with said interconnect conductors.

13. The user re-programmable interconnect architecture of claim 8 wherein both said first group of decoder lines and said second group of decoder lines are in non-parallel relationship with said interconnect conductors.

14. The user re-programmable interconnect architecture of claim 10 wherein both said first group of decoder lines and said second group of decoder lines are in non-parallel relationship with said interconnect conductors.

15. The user re-programmable interconnect architecture of claim 6 wherein said group of interconnect conductors comprises a first subgroup of $K_1$ interconnect conductors and a second subgroup of $K_2$ interconnect conductors and wherein said first subgroup and said second subgroup of interconnect conductors intersect at K predetermined locations, and wherein K, $K_1$, and $K_2$ are all integers, and wherein the user re-programmable interconnect architecture is partially depopulated so that N is an integer in the range of about 25% of K to about 75% of K.

16. The user re-programmable interconnect architecture of claim 15 wherein said decoder/drivers comprise:
   a first group of decoder lines each one of which is connected to one of the outputs of said first active storage elements;
   a second group of decoder lines each one of which is connected to one of the outputs of said second active storage elements.

17. The user re-programmable interconnect architecture of claim 16 wherein said first group of decoder lines are in non-parallel relationship with said interconnect conductors.

18. The user re-programmable interconnect architecture of claim 17 wherein said first group and said second group of decoder lines are single line decoder lines.

19. The user re-programmable interconnect architecture of claim 16 wherein both said first group of decoder lines and said second group of decoder lines are in non-parallel relationship with said interconnect conductors.

20. The user re-programmable interconnect architecture of claim 19 wherein said active storage elements comprise SRAM cells, said user re-programmable interconnect elements comprise MOS transistors, and said decoder/drivers comprise ANDing circuits.

21. The user re-programmable interconnect architecture of claim 20 wherein said first group and said second group of decoder lines are single line decoder lines.

22. A user re-programmable interconnect architecture comprising:
   a plurality of interconnect conductors comprising a group of interconnect conductors;
   N user re-programmable interconnect elements connected between different selected ones of said plurality of interconnect conductors in said group, where N is an integer, each of said user re-programmable interconnect elements being switchable between an on state and an off state in response to the state of a control signal;
   $M_1$ first active storage elements, each having a first unselected state and a second selected state available at an output thereof, where $M_1$ is an integer;
   a first decoder having $M_1$ inputs connected to outputs of said first active storage elements and having a plurality of outputs, each of said outputs providing a control signal to one of said N user re-programmable interconnect elements in a first subgroup thereof, wherein the state of each control signal is a function of the state of the $M_1$ inputs of said first decoder;
   $M_2$ second active storage elements, each having a first unselected state and a second selected state available at an output thereof, where $M_2$ is an integer; and
   a second decoder having $M_1$ inputs connected to outputs of said active storage elements and having a plurality of outputs, each of said outputs providing a control signal to one of said N user re-programmable interconnect elements in a second subgroup thereof, wherein the state of each control signal is a function of the state of the $M_2$ inputs of said second decoder; and
   wherein $M_1+M_2<N$.

23. The user re-programmable interconnect architecture of claim 22 wherein:
   said first decoder comprises a first set of decoder lines and said second decoder comprises a second set of decoder lines; and
   said first set of decoder lines and said second set of decoder lines are comprised of single line decoder lines.

24. The user re-programmable interconnect architecture of claim 23 wherein:
   at least one element of said first set of decoder lines and said group of interconnect conductors are in non-parallel relationship with each other.

25. The user re-programmable interconnect architecture of claim 24 wherein:
   a plurality of the elements of said first set of decoder lines are in non-parallel relationship with said group of interconnect conductors.

26. The user re-programmable interconnect architecture of claim 25 wherein:
   a plurality of the elements of said first set of decoder lines and a plurality of the elements of said second set of decoder lines are in non-parallel relationship with said group of interconnect conductors.

27. The user re-programmable interconnect architecture of claim 26 wherein:
   substantially all of the elements of said first set of decoder lines and substantially all of the elements of said second set of decoder lines are in non-parallel relationship with said group of interconnect conductors.

28. The user re-programmable interconnect architecture of claim 27 wherein said group of interconnect conductors comprises a first subgroup of $K_1$ interconnect conductors and a second subgroup of $K_2$ interconnect conductors wherein said first subgroup and said Second subgroup of interconnect conductors intersect at K predetermined locations, and wherein K, $K_1$, and $K_2$ are all integers, and wherein the user re-programmable interconnect architecture is partially depopulated so that N is an integer in the range of about 25% of K to about 75% of K.

29. A user re-programmable interconnect architecture comprising:
   a plurality of interconnect conductors comprising a group of interconnect conductors;
   N user re-programmable interconnect elements connected between different selected ones of said plurality of interconnect conductors in said group, where N is an integer, each of said user re-programmable interconnect elements having a first control input and a second control input, each of said user re-programmable interconnect elements being switchable between an on state and an off state in response to the state of an internally-generated control signal;
   $M_1$ first active storage elements, each having a first unselected state and a second selected state and an output, where $M_1$ is an integer, the output of each first active storage element providing an off output signal if said storage element is in its unselected state and an on signal if said storage element is in its selected state, each of said outputs connected to a first control input of each of a first group of said user re-programmable interconnect elements;
   $M_2$ second active storage elements, each having a first unselected state and a second selected state and an output, where $M_2$ is an integer, the output of each second active storage element providing an off output signal if said storage element is in its unselected state and an on signal if said storage element is in its selected state, each of said outputs connected to a second control input of a second group of said user re-programmable interconnect elements such that each of said user re-programmable interconnect elements is connected to an output from one of said first and one of said second active storage elements;

a control-signal generator, in each of said user re-programmable interconnect elements, for generating said control signal to place it in its on state in response to the presence of on output signals from the first and second active storage elements to which it is connected; and wherein $M_1+M_2<N$.

30. A user re-programmable interconnect architecture disposed on a microcircuit substrate comprising:

an input/output pad;

a first input/output pad conductor extending in a first direction from said input output pad;

a second input/output pad conductor extending in a second direction from said input/output pad, said second direction substantially different from said first direction;

a plurality of first interconnect conductors insulated from and intersecting said first input/output pad conductor;

a plurality of second interconnect conductors insulated from and intersecting said second input/output pad conductor, said second interconnect conductors insulated from and forming intersections with said first interconnect conductors;

a plurality of first user re-programmable interconnect elements, one of said first user re-programmable interconnect elements connected between each of said first interconnect conductors and said first input/output pad conductor, each of said first user re-programmable interconnect elements being switchable between an on state and an off state in response to the state of a control signal;

a first plurality of active storage elements, each one of said first plurality of active storage elements having a first unselected state and a second selected state and providing said control signal to a different one of said plurality of first user re-programmable interconnect elements in response to its state;

a plurality of second user re-programmable interconnect elements, one of said second user re-programmable interconnect elements connected between each of said second interconnect conductors and said second input/output pad conductor, each of said second user re-programmable interconnect elements being switchable between an on state and an off state in response to the state of a control signal;

a second plurality of active storage elements, each one of said second plurality of active storage elements having a first unselected state and a second selected state and providing said control signal to a different one of said plurality of second user re-programmable interconnect elements in response to its state;

N third user re-programmable interconnect elements, where N is an integer, one of said third user re-programmable interconnect elements connected at selected ones of said intersections between said first and second interconnect conductors, each of said third user re-programmable interconnect elements being switchable between an on state and an off state in response to the state of a control signal;

$M_1$ third active storage elements, each having an output and having a first unselected state and a second selected state, where $M_1$ is an integer, the output of each third active storage element providing an off output signal if said storage element is in its unselected state and an on signal if said storage element is in its selected state, each of said outputs connected to at least one first control input of each of a first group of said third user re-programmable interconnect elements;

$M_2$ fourth active storage elements, each having an output and a first unselected state and a second selected state, where $M_2$ is an integer, the output of each fourth active storage element providing an off output signal if said storage element is in its unselected state and an on signal if said storage element is in its selected state, each of said outputs connected to at least one second control input of a second group of said third user re-programmable interconnect elements, said first group and said second group chosen such that each of said user re-programmable interconnect elements is connected to an output from one of said third and one of said fourth active storage elements;

a control-signal generator, in each of said third user re-programmable interconnect elements, for generating said control signal to place it in its on state in response to the presence of on output signals from the third and fourth active storage elements to which it is connected; and wherein $M_1+M_2<N$.

31. A user re-programmable interconnect architecture disposed on a microcircuit substrate comprising:

a plurality of I/O structures arranged in an array of rows and columns, each of said I/O structures comprising an I/O pad, a first input/output pad conductor extending in a first direction from said input output pad and a second input/output pad conductor extending in a second direction from said input/output pad, said second direction substantially different from said first direction;

a row group of first interconnect conductors in each row of said array, each of said first interconnect conductors in each row group insulated from and intersecting said first input/output pad conductors of each of said I/O structures in their row;

a column group of second interconnect conductors in each column of said array, each of said second interconnect conductors in each column group insulated from and intersecting said second input/output pad conductors of each of said I/O structures in their column, said second interconnect conductors insulated from and forming intersections with said first interconnect conductors in each row group thereof;

a plurality of first user re-programmable interconnect elements, one of said first user re-programmable interconnect elements connected between each of said first interconnect conductors and said first input/output pad conductors at intersections thereof, each of said first user re-programmable interconnect elements being switchable between an on state and an off state in response to the state of a control signal;

a first plurality of active storage elements, each one of said first plurality of active storage elements having a first unselected state and a second selected state and providing said control signal to a different one of said plurality of first user re-programmable interconnect elements in response to its state;

a plurality of second user re-programmable interconnect elements, one of said second user re-programmable interconnect elements connected between each of said second interconnect conductors and said second input/output pad conductors at intersections thereof, each of said second user re-programmable interconnect elements being switchable between an on state and an off state in response to the state of a control signal;

a second plurality of active storage elements, each one of said second plurality of active storage elements having a first unselected state and a second selected state and providing said control signal to a different one of said plurality of second user re-programmable interconnect elements in response to its state;

N third user re-programmable interconnect elements associated with each intersecting row group and column group of interconnect conductors in each I/O structure, where N is an integer, one of said third user re-programmable interconnect elements connected at selected ones of said intersections between said first and second interconnect conductors, each of said third user re-programmable interconnect elements being switchable between an on state and an off state in response to the state of a control signal;

$M_1$ third active storage elements associated with each intersecting row group and column group of interconnect conductors in each I/O structure, each having an output and having a first unselected state and a second selected state, where $M_1$ is an integer, the output of each third active storage element providing an off output signal if said storage element is in its unselected state and an on signal if said storage element is in its selected state, each of said outputs connected to at least one first control input of each of a first group of said third user re-programmable interconnect elements in its I/O structure;

$M_2$ fourth active storage elements associated with each intersecting row group and column group of interconnect conductors in each I/O structure, each having an output and a first unselected state and a second selected state, where $M_2$ is an integer, the output of each fourth active storage element providing an off output signal if said storage element is in its unselected state and an on signal if said storage element is in its selected state, each of said outputs connected to at least one second control input of a second group of said third user re-programmable interconnect elements in its I/O structure, said first group and said second group chosen such that each of said user re-programmable interconnect elements is connected to an output from one of said third and one of said fourth active storage elements;

a control-signal generator, in each of said third user re-programmable interconnect elements, for generating said control signal to place it in its on state in response to the presence of on output signals from the third and fourth active storage elements to which it is connected; and wherein $M_1+M_2<N$.

32. A user re-programmable interconnect architecture disposed on a microcircuit substrate comprising:

a plurality of interconnect conductors;

a plurality of N switching elements organized into a plurality of switching matrices, wherein each switching element is capable of being switched between an on state and an off state, and each switching element is capable of shorting at least two of said interconnect conductors when it is in said on state;

at least K intersections formed by said interconnect conductors;

N Q-input decoders wherein Q is an integer greater than 1, one of said N Q-input decoders associated with each N switching elements;

an output of each of said Q-input decoders connected to and controlling the state of its associated N switching elements;

Q sets of decoder lines, each decoder line driven by a storage element wherein one decoder line from each of said Q sets of decoder lines is connected to one of the inputs of each said Q-bit decoder.

33. The user re-programmable interconnect device of claim 32 wherein:

at least one of said Q sets of decoder lines is in non-parallel relationship to said interconnect conductors.

34. The user re-programmable interconnect device of claim 32 wherein:

at least two of said Q sets of decoder lines are in non-parallel relationship to said interconnect conductors.

35. The user re-programmable interconnect device of claim 32 wherein:

Q of said Q sets of decoder lines are in non-parallel relationship to said interconnect conductors.

36. The user re-programmable interconnect device of claim 32 wherein:

at least one of said switching matrices is partially depopulated so that $25\%K \leq N \leq 75\%K$.

37. A user re-programmable interconnect architecture according to claim 32 wherein $Q>3$.

38. A user re-programmable interconnect architecture comprising:

a plurality of interconnect conductors;

an $I \times J$ array of N user re-programmable interconnect elements connected between different selected ones of said plurality of interconnect conductors, where I, J and N are integers and I and J are greater than one, each of said user re-programmable interconnect elements being switchable between an on state and an off state in response to the state of a control signal;

M active storage elements, each having a first unselected state and a second selected state, where M is an integer and $M<N$;

a decoder having M inputs connected to outputs of said active storage elements and having N outputs, each of said outputs providing a control signal to one of said N user re-programmable interconnect elements, said control signal having an on state and an off state, and wherein the state of each control signal is a function of the state of the M inputs of said decoder.

39. A user re-programmable interconnect architecture comprising:

a plurality of non-converging interconnect conductors;

N user re-programmable interconnect elements connected between different selected ones of said plurality of interconnect conductors, where N is an integer, each of said user re-programmable interconnect elements being switchable between an on state and an off state in response to the state of a control signal;

M active storage elements, each having a first unselected state and a second selected state, where M is an integer and $M<N$;

decoder means having M inputs connected to outputs of said active storage elements and having N outputs, each of said outputs providing a control signal to one of said N user re-programmable interconnect elements, said control signal having an on state and an off state, and wherein the state of each control signal is a function of the state of the M inputs of said decoder means.

40. A user re-programmable interconnect architecture comprising:

a plurality of interconnect conductors;

an $I \times J$ array of N user re-programmable interconnect elements connected between different selected ones of said plurality of interconnect conductors, where I, J and N are integers and I and J are greater than one, each of said user re-programmable interconnect elements being switchable between an on state and an off state in response to the state of a control signal;

M active storage elements, each having a first unselected state and a second selected state, where M is an integer and $M<N$;

a decoder having M inputs connected to outputs of said active storage elements and having N outputs, each of said outputs simultaneously providing a control signal to one of said N user re-programmable interconnect elements, said control signal having an on state and an off state, and wherein the state of each control signal is a function of the state of the M inputs of said decoder.

* * * * *